(12) United States Patent
Yoshida et al.

(10) Patent No.: US 7,345,968 B2
(45) Date of Patent: Mar. 18, 2008

(54) WRITE ONCE TYPE RECORDING MEDIUM, RECORDING DEVICE AND RECORDING METHOD FOR WRITE ONCE TYPE RECORDING MEDIUM, AND REPRODUCTION DEVICE AND REPRODUCTION METHOD FOR WRITE ONCE TYPE RECORDING MEDIUM

(75) Inventors: Masayoshi Yoshida, Tokorozawa (JP); Takeshi Koda, Tokorozawa (JP); Akira Imamura, Tokorozawa (JP)

(73) Assignee: Pioneer Corporation, Tokyo (JP)

( * ) Notice: Subject to any disclaimer, the term of this patent is extended or adjusted under 35 U.S.C. 154(b) by 273 days.

(21) Appl. No.: 11/133,313

(22) Filed: May 20, 2005

(65) Prior Publication Data

US 2005/0281164 A1 Dec. 22, 2005

Related U.S. Application Data

(62) Division of application No. 10/535,839, filed as application No. PCT/JP2004/003565 on Mar. 17, 2004.

(30) Foreign Application Priority Data

Mar. 17, 2003 (JP) .............................. 2003-072771

(51) Int. Cl.
*G11B 15/52* (2006.01)
(52) U.S. Cl. .................... 369/47.14; 369/53.15
(58) Field of Classification Search .............. None
See application file for complete search history.

(56) References Cited

U.S. PATENT DOCUMENTS 5,065,388 A 11/1991 Roth et al.
6,160,778 A 12/2000 Ito et al.
6,469,978 B1 10/2002 Ohata et al.
6,922,802 B2 * 7/2005 Kim et al. ................... 714/723

FOREIGN PATENT DOCUMENTS

| EP | 0 997 904 | 5/2000 |
|---|---|---|
| JP | 64-46280 | 2/1989 |
| JP | 9-102173 | 4/1997 |
| JP | 2002-312940 | 10/2002 |
| WO | WO 84/00628 | 2/1984 |
| WO | WO 01/22416 | 3/2001 |
| WO | WO 2004/081922 | 9/2004 |

* cited by examiner

*Primary Examiner*—Paul Huber
(74) *Attorney, Agent, or Firm*—Young & Thompson

(57) ABSTRACT

On a write-once-type recording medium 10, there are provided: a definite defect management area 13 to definitely record therein defect management information; and a plurality of temporary defect management areas 14A, 14B, and 14C to temporarily record therein the defect management information. If the recording medium 10 is not yet finalized, every time the defect management information is updated, the updated defect management information is recorded into any one of the plurality of temporary defect management areas. Moreover, a status information recording area 15 is provided on the recording medium 10, and status information for indicating the temporary defect management area in which there is the defect management information recorded at last is recorded into the status information recording area 15. By referring to the status information, it is possible to quickly specify the defect management information recorded at last.

8 Claims, 19 Drawing Sheets

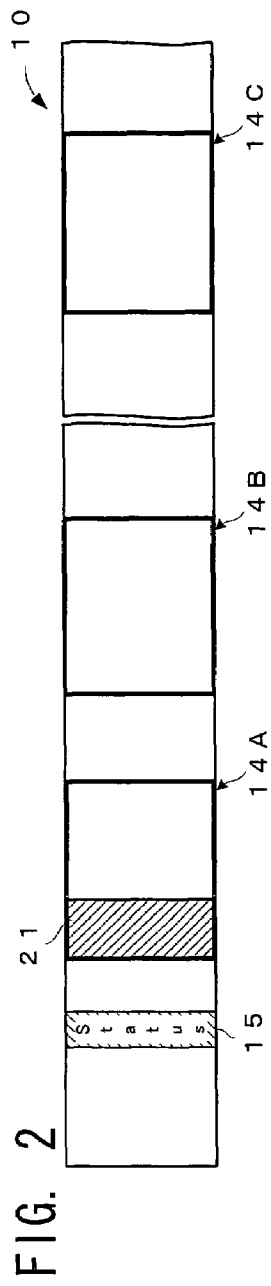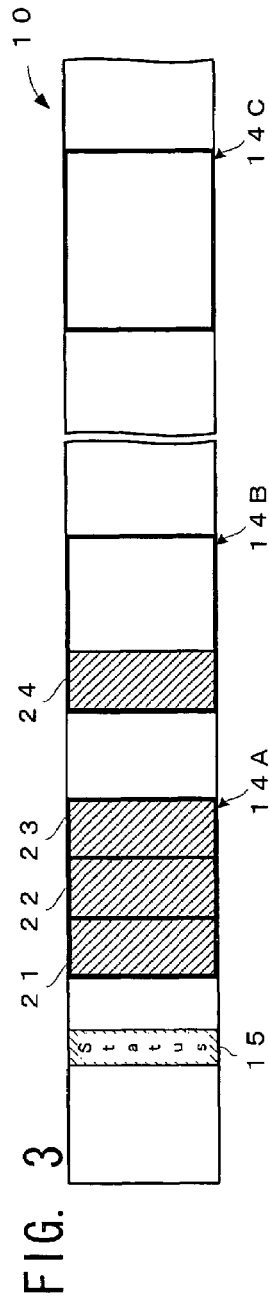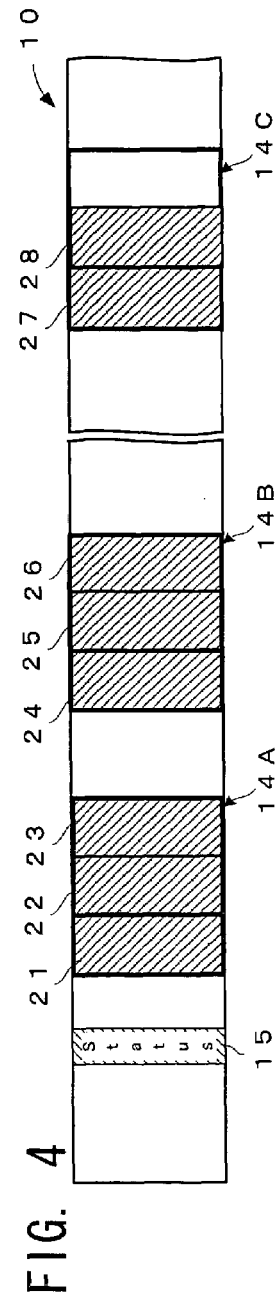

| Defect Address | Spare Address | Other Info. |
|---|---|---|
| Address aaaa | Address gggg | |
| Address bbbb | Address kkkk | |
| Address cccc | Address mmmm | |
| Address dddd | Address nnnn | |
| ⋮ | ⋮ | |

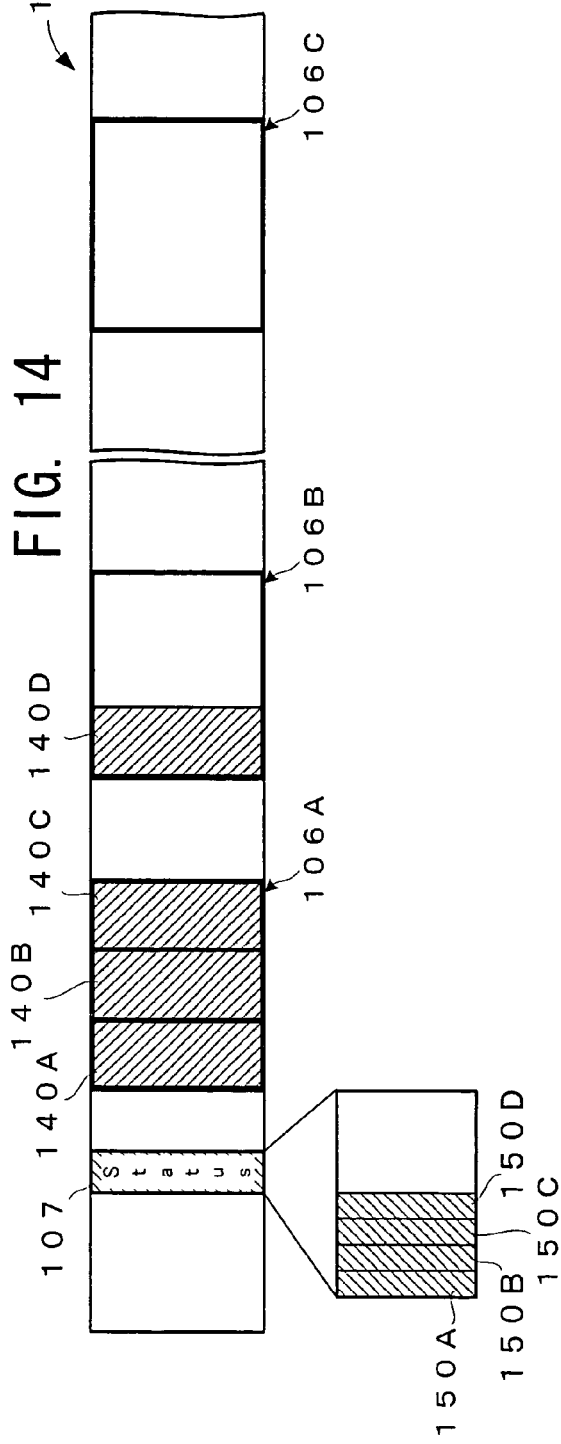

FIG. 15

| | Bit 2<br>Third Temporary Defect Management Area (106C) | Bit 1<br>Second Temporary Defect Management Area (106B) | Bit 0<br>First Temporary Defect Management Area (106A) |
|---|---|---|---|
| | 0 | 0 | 1 |

160 →

| Start Address of Each of Temporary Defect Management Areas |
| Areal Size of Each of Temporary Defect Management Areas |
| Full Flag — Status Info. |

0 : There is Unrecorded Area
1 : There is No Unrecorded Area

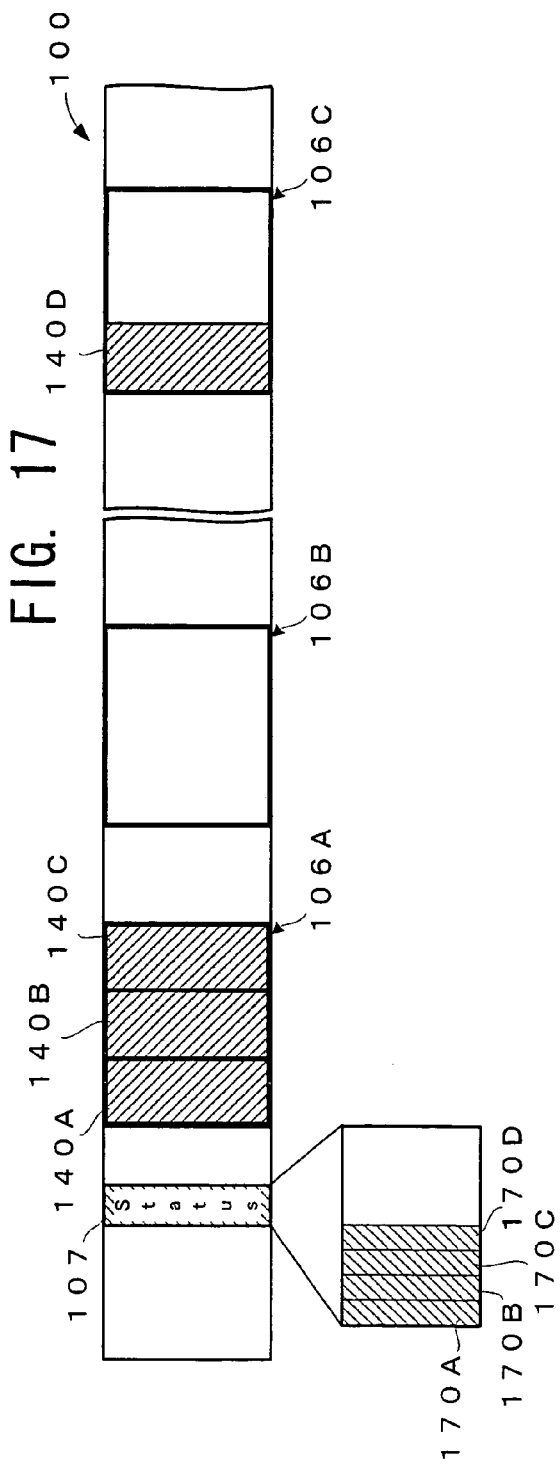

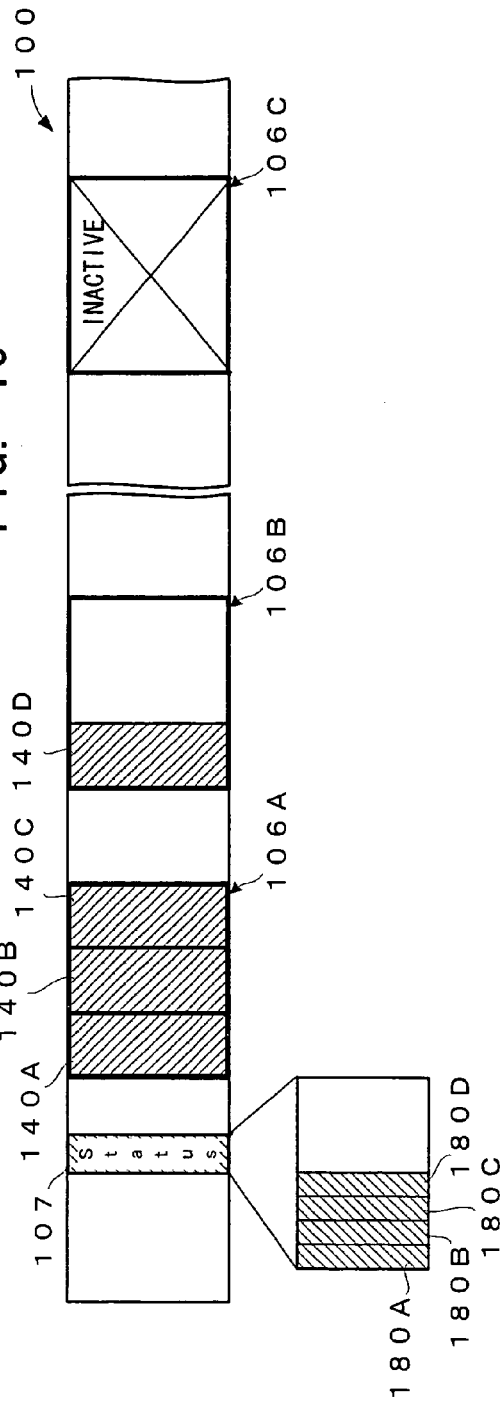

WRITE ONCE TYPE RECORDING MEDIUM, RECORDING DEVICE AND RECORDING METHOD FOR WRITE ONCE TYPE RECORDING MEDIUM, AND REPRODUCTION DEVICE AND REPRODUCTION METHOD FOR WRITE ONCE TYPE RECORDING MEDIUM

TECHNICAL FIELD

The present invention relates to a write-once-type recording medium, a recording apparatus for and a recording method of recording record data onto the write-once-type recording medium, and a reproducing apparatus for and a reproducing method of reproducing the record data recorded on the write-once-type recording medium.

BACKGROUND ART

As a technique of improving the reliability of the recording and reading of record data on a high-density recording medium, such as an optical disc, a magnetic disc, and a magneto optical disc, there is defect management. Namely, when there are scratches or dusts, or deterioration (which are collectively referred to as a "defect") on the recording medium, data to be recorded or already recorded at the position of the defect is recorded in another area on the recording medium (which is referred to as a "spare area"). As described above, by evacuating, to the spare area, the record data which is possibly imperfectly or incompletely recorded or read because of the defect, it is possible to improve the reliability of the recording and reading of the record data (refer to Japanese Patent Application Laying Open NO. Hei 11-185390).

In general, a defect list is generated to perform the defect management. On the defect list, there are recorded address information for indicating the position of a defect on the recording medium, and address information for indicating a position in the spare area (e.g. a recording position in the spare area) to which the data to be recorded or already recorded at the position of the defect is evacuated.

In general, the defect list is generated when a recording medium is initialized or formatted. It is also generated when the record data is recorded onto the recording medium and when the position of a defect is found by verifying the record data, or the like. By recording or reproducing the record data, the defect list is generated or updated every time the position of the defect is detected.

When the record data is recorded onto the recording medium, the defect list is referred to. This allows the recording of the record data onto the recording medium away from the position of a defect. On the other hand, the defect list is also referred to when the record data recorded on the recording medium is reproduced. This makes it possible to surely read both the record data recorded in a normal recording area and the record data recorded in the spare area because of the presence of a defect, on the basis of the defect list.

The defect list is generally recorded in a specific area on the recording medium, which is the object of the generation or updating of the defect list. The defect list is read from the recording medium next time when the record data recorded on the recording medium is reproduced or when other record data is rewritten or additionally recorded. Then the defect list is referred to in a recording operation by a recording apparatus or in a reproduction operation by a reproducing apparatus.

DISCLOSURE OF INVENTION

The defect list is recorded in a specific area on the recording medium. For example, with respect to a rewritable-type optical disc using a blue laser, the defect list is recorded in a predetermined area (which is hereinafter referred to as a "defect management area") reserved in a lead-in area or lead-out area on the disc.

As described above, the defect list is updated when the record data is recorded and rewritten and when the position of the defect is found, or the like. Then, the defect list is overwritten in the defect management area on the recording medium, which is the object of the recording and rewriting, every time the defect list is updated by the recording and rewriting of record data. Namely, the defect list in the defect management area is rewritten every time the defect list is updated.

Such updating of the defect list by rewriting it can be realized only in case that the recording medium is a rewritable-type. In case that the recording medium is a so-called "write-once-type recording medium", for example, a write-once-type optical disc, it is necessary to use another method to realize the updating of the defect list. For example, as a method of realizing the updating of the defect list, there is such a method that every time the defect lit is updated, the updated defect list is additionally recorded into a new unrecorded area on the write-once-type recording medium.

According to this method, however, every time the defect list is updated, it is necessary to reserve an area to additionally record therein the updated defect list. Moreover, it is necessary to predict in advance how many times the defect list will be updated, and reserve in advance the defect management area large enough to record the defect list by the number of times. In any cases, in order to realize the updating of the defect list on the write-once-type recording medium, it is necessary to reserve a wide range of area (i.e. the defect management area) to record therein the defect list, as compared to the case where the defect list can be rewritten.

As a result, there is such a problem that the data structure of the write-once-type recording medium is different from that of a rewritable-type recording medium, and thus there is no compatibility with each other, with regard to the reading of the data recorded on the recording medium. For example, if the defect management area is expanded in the lead-in area, the lead-in area is expanded, which causes a different range of the lead-in area between the write-once-type recording medium and the rewritable-type recording medium. This causes incompatibility between the both recording media, which may result in such a problem that an existing drive apparatus for the rewritable-type recording medium cannot reproduce the data on the write-once-type recording medium.

It is therefore an object of the present invention to provide: a write-once-type recording medium which has a defect management function and has compatibility with a rewritable-type recording medium; a recording apparatus for and a recording method of recording the record data onto the write-once-type recording medium; and a reproducing apparatus for and a reproducing method of reproducing the record data recorded on the write-once-type recording medium.

The above object of the present invention can be achieved by a write-once-type recording medium provided with: a data area to record therein record data; a control information recording area to record therein information for controlling an operation of recording and/or reading in the data area, the control information recording area including a definite defect management area to record therein defect management information of the data area; a plurality of temporary defect management areas to temporarily record therein the defect management information of the data area; and a status information recording area in which status information for indicating a recording status of one portion or each of the plurality of temporary defect management areas is to be recorded.

The above object of the present invention can be also achieved by a recording apparatus for recording record data onto a write-once-type recording medium provided with: (i) a data area to record therein the record data; (ii) a control information recording area to record therein information for controlling an operation of recording and/or reading in the data area, the control information recording area including a definite defect management area to record therein defect management information of the data area; (iii) a plurality of temporary defect management areas to temporarily record therein the defect management information of the data area; and (iv) a status information recording area in which status information for indicating a recording status of one portion or each of the plurality of temporary defect management areas is to be recorded, the recording apparatus provided with: a first recording device for recording the record data into the data area; a memory device for storing therein the defect management information; a second recording device for recording the defect management information stored in the memory device, into any one of the plurality of temporary defect management areas; a status information generating device for generating the status information for indicating the recording status of one portion or each of the plurality of temporary defect management areas; a third recording device for recording the status information generated by the status information generating device, into the status information recording area; and a fourth recording device for recording the defect management information stored in the memory device into the definite defect management area.

The above object of the present invention can be also achieved by a reproducing apparatus for reproducing record data recorded on a write-once-type recording medium provided with: (i) a data area to record therein the record data; (ii) a control information recording area to record therein information for controlling an operation of recording and/or reading in the data area, the control information recording area including a definite defect management area to record therein defect management information of the data area; (iii) a plurality of temporary defect management areas to temporarily record therein the defect management information of the data area; and (iv) a status information recording area in which status information for indicating a recording status of one portion or each of the plurality of temporary defect management areas is to be recorded, the reproducing apparatus provided with: a first reading device for reading the status information recorded in the status information recording area; an area recognizing device for recognizing one temporary defect management area in which the defect management information recorded at last in time is recorded, on the basis of the status information read by the first reading device; a second reading device for reading the defect management information recorded in the one temporary defect management area recognized by the area recognizing device; and a reproducing device for reproducing the record data recorded in the data area, on the basis of the defect management information read by the second reading device.

The above object of the present invention can be also achieved by a first computer program of instructions for tangibly embodying a program of instructions executable by a computer to make the computer function as the above-described recording apparatus of the present invention (including its various aspects).

The above object of the present invention can be also achieved by a second computer program of instructions for tangibly embodying a program of instructions executable by a computer to make the computer function as the above-described reproducing apparatus of the present invention (including its various aspects).

The above object of the present invention can be also achieved by a first computer program product in a computer-readable medium for tangibly embodying a program of instructions executable by a computer to make the computer function as the above-described recording apparatus of the present invention (including its various aspects).

The above object of the present invention can be also achieved by a second computer program product in a computer-readable medium for tangibly embodying a program of instructions executable by a computer to make the computer function as the above-described reproducing apparatus of the present invention (including its various aspects).

According to the first or second computer program product of the present invention, the recording apparatus or the reproducing apparatus of the present invention described above can be embodied relatively readily, by loading the computer program product from a recording medium for storing the computer program product, such as a ROM, a CD-ROM, a DVD-ROM, a hard disk or the like, into the computer, or by downloading the computer program product, which may be a carrier wave, into the computer via a communication device. More specifically, the first or second computer program product may be provided with computer readable codes (or computer readable commands) to make the computer to function as the recording apparatus or the reproducing apparatus of the present invention described above.

The above object of the present invention can be also achieved by a recording method of recording record data onto a write-once-type recording medium provided with: (i) a data area to record therein the record data; (ii) a control information recording area to record therein information for controlling an operation of recording and/or reading in the data area, the control information recording area including a definite defect management area to record therein defect management information of the data area; (iii) a plurality of temporary defect management areas to temporarily record therein the defect management information of the data area; and (iv) a status information recording area in which status information for indicating a recording status of one portion or each of the plurality of temporary defect management areas is to be recorded, the recording method provided with: a first recording process of recording the record data into the data area; a defect management information generating process of generating or updating the defect management information; a second recording process of recording the defect management information generated or updated in the defect management information generating process, into any one of the plurality of temporary defect management areas; a status information generating process of generating the status information for indicating the recording status of one portion or each of the plurality of temporary defect management areas; a third recording process of recording the status information generated in the status information generating process, into the status information recording area; a finalizing process of finalizing the write-once-type recording medium; and a fourth recording process of recording the defect management information generated or updated in the defect management information generating process, into the definite defect management area, if finalizing is performed in the finalizing process.

The above object of the present invention can be also achieved by a reproducing method of reproducing record data recorded on a write-once-type recording medium provided with: (i) a data area to record therein the record data; (ii) a control information recording area to record therein information for controlling an operation of recording and/or reading in the data area, the control information recording area including a definite defect management area to record therein defect management information of the data area; (iii) a plurality of temporary defect management areas to temporarily record therein the defect management information of the data area; and (iv) a status information recording area in which status information for indicating a recording status of one portion or each of the plurality of temporary defect management areas is to be recorded, the reproducing method provided with: a finalize detecting process of detecting whether or not the write-once-type recording medium is already finalized; a first reading process of reading the defect management information recorded in the definite defect management area and of storing the defect management information into a memory device, if the write-once-type recording medium is already finalized; a second reading process of reading the status information recorded in the status information recording area, if the write-once-type recording medium is not yet finalized; an area recognizing process of specifying one temporary defect management area in which the defect management information recorded at last in time is recorded, on the basis of the status information read in the first reading process; a third reading process of reading the defect management information recorded in the one temporary defect management area recognized in the area recognizing process; and a reproducing process of reproducing the record data recorded in the data area, on the basis of the defect management information read in the third reading process.

These functions and other advantages of the present invention will be apparent from the following descriptions of embodiments and examples.

BRIEF DESCRIPTION OF DRAWINGS

FIG. 2 is an explanatory diagram showing a status in which one piece of defect management information is recorded on the write-once-type recording medium of the present invention;

FIG. 3 is an explanatory diagram showing a status in which four pieces of defect management information are recorded on the write-once-type recording medium of the present invention;

FIG. 4 is an explanatory diagram showing a status in which eight pieces of defect management information are recorded on the write-once-type recording medium of the present invention;

FIG. 13 is an explanatory diagram showing a first example of status information;

FIG. 14 is an explanatory diagram showing a status in which four pieces of defect management information are recorded on an optical disc;

FIG. 15 is an explanatory diagram showing a second example of the status information;

FIG. 16 is an explanatory diagram showing a third example of the status information;

FIG. 17 is an explanatory diagram showing a status in which four pieces of defect management information are recorded on the optical disc;

FIG. 18 is an explanatory diagram showing a fourth example of the status information;

FIG. 19 is an explanatory diagram showing a status in which four pieces of defect management information are recorded on the optical disc;

BEST MODE FOR CARRYING OUT THE INVENTION

The embodiments of the present invention will be explained with reference to the drawings hereinafter.

Embodiment of Write-once-type Recording Medium

An embodiment of the write-once-type recording medium of the present invention will be explained with reference to the drawings. Incidentally, the drawings used for the explanation of the embodiments of the present invention embody constitutional elements or the like of the recording medium, the recording apparatus, and the reproducing apparatus of the present invention only for the purpose of explaining technical ideas thereof. The shape, size, position, connection relationship, and the like of various constitutional elements or the like are not limited to the drawings.

Figure 1:
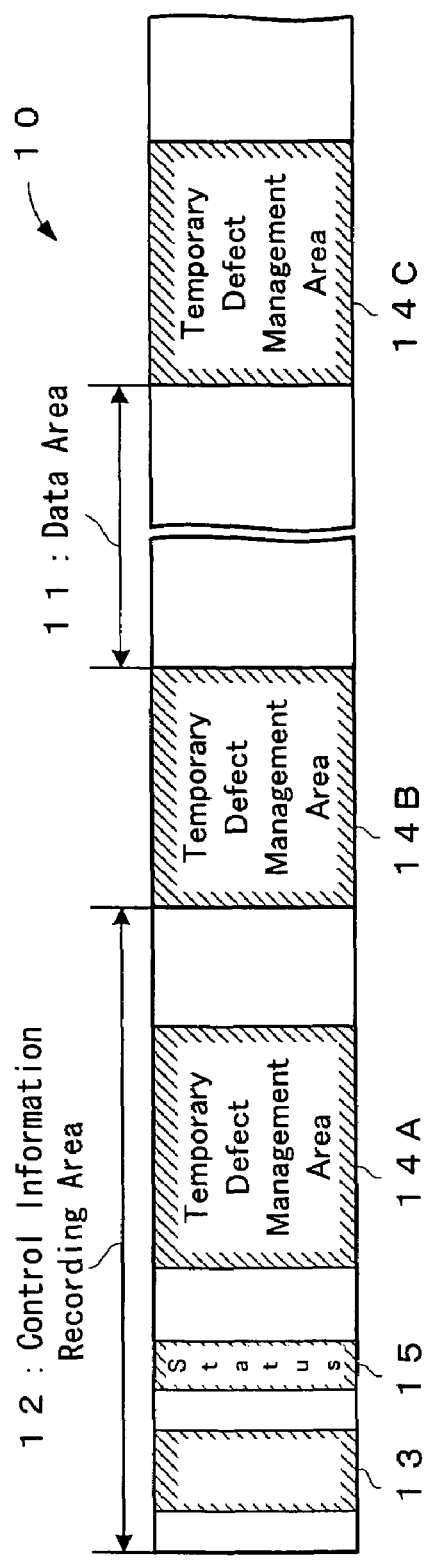
FIG. 1 is an explanatory diagram showing an embodiment of a write-once-type recording medium of the present invention.

FIG. 1 shows the recording structure of a write-once-type recording medium 10 in the embodiment of the present invention. The write-once-type recording medium 10 is a disc-shaped recording medium. The left side of FIG. 1 is the inner circumferential side of the write-once-type recording medium, and the right side is the outer circumferential side of the write-once-type recording medium. Incidentally, the shape of the write-once-type recording medium of the present invention is not limited to a disc-shape. The present invention can be applied to recording media of other shapes, such as a card-shaped recording medium. Moreover, the present invention can be applied to a two-layer disc (i.e. a dual or double layer type disc). Moreover, the recording method of the write-once-type recording medium of the present invention is not limited. The present invention can be applied to a recording medium which uses, for example, light, magnetism, magneto-optics, a phase change, the polarization direction of a dielectric substance, near-field light, or the like.

The recording medium 10 is a write-once-type recording medium which allows the recording of data or information only once at each position.

As shown in FIG. 1, the recording medium 10 is provided with: a data area 11; a control information recording area 12; a definite defect management area 13; a plurality of temporary defect management areas 14A, 14B, and 14C; and a status information recording area 15.

As shown in FIG. 1, the definite defect management area 13, the status information recording area 15, and the temporary defect management area 14A are in the control information recording area 12. The temporary defect management area 14B is placed between the control information recording area 12 and the data area 11. The temporary defect management area 14C is placed on the outer circumferential side of the data area 11. Incidentally, except that the definite defect management area 13 is placed in the control information recording area 12, there is no limitation on the arrangement of these areas. For example, the status information recording area 15 may be placed out of the control information recording area 12, and the temporary defect management area 14A may be placed out of the control information recording area 12. However, by arranging these areas as shown in FIG. 1, it is possible to obtain an advantageous effect. This advantageous effect will be described later.

The data area 11 is intended to record therein the "record data". The record data is data which is mainly the object of reproduction or execution, including, e.g., image data; audio data; text data; content data; a computer program; or the like.

The control information recording area 12 is intended to record therein control information. The control information is to control an operation of recording/reading in the data area. It includes information for indicating the attribute and type of the recording medium, information for managing the recording address of the record data, information for controlling a drive apparatus, information for performing defect management, and the like, for example. The control information recording area 12 is a lead-in area or a lead-out area, for example.

The definite defect management area 13 is intended to record therein the defect management information of the data area 11. The temporary defect management areas 14A, 14B, and 14C are intended to temporarily record therein the defect management information of the data area 11.

The defect management information is information used for the defect management. The defect management is as follows; namely, if there is a defect, such as scratches, dusts, and deterioration, in or on the recording medium 10, the record data is recorded away from the position of the defect. At the same time, the data to be recorded or already recorded at the position of the defect is alternatively recorded into a spare area. Moreover, the following processing is performed as a part of the defect management: recognizing the position of a defect upon reproducing the record data recorded on the recording medium 10; and reading the record data to be originally recorded or already recorded at the position of the defect, from the spare area.

A defect list is used for the defect management. On the defect list, there are recorded: address information for indicating the position of a defect on the recording medium 10; and address information for indicating a position (i.e. a position in the spare area) where the record data to be recorded or already recorded at the position of the defect is recorded. The defect management information includes such a defect list.

The defect management information is generated when the recording medium 10 is initialized or when the record data is recorded onto the recording medium 10 (e.g. at the time of verifying). Moreover, the presence of a defect and its position differ on the individual recording media. Therefore, the defect management information also differs on the individual recording media. Thus, the defect management information generated for the recording medium 10 is recorded onto the recording medium 10. For example, when the initialization of the recording medium 10 is completed, or when the recording of the record data is completed, the defect management information is recorded onto the recording medium 10.

The defect changes or increases, along with the continuous use of the recording medium 10. For example, fingerprints are often left on a recording surface during the use of the recording medium. Thus, the defect management information is updated every time there is a chance to perform the recording or reproduction with respect to the recording medium 10. For example, at the time of the additional or postscript recording or the reproduction with respect to the recording medium 10, the defect management information recorded on the recording medium 10 is read, and the address information of a new defect or the like is appended to the defect list included in the defect management information. The defect management information updated in this manner is recorded again onto the recording medium 10 when the additional recording or the reproduction is completed, for example.

As described above, the definite defect management area 13 and the temporary defect management areas 14A, 14B, and 14C have in common in that they are all the areas to record therein the defect management information. However, they are different in that the definite defect management area 13 is an area to definitely record therein the defect management information, while the temporary defect management areas 14A, 14B, and 14C are areas to temporarily record therein the defect management information.

If the updating of the defect management information is predetermined or scheduled, the defect management information is recorded into any one of the temporary defect management areas 14A, 14B, and 14C. The case where the updating of the defect management information is predetermined is a case where the recording medium 10 is not finalized, for example.

If the updating of the defect management information is not necessary or not possible, the defect management information is recorded into the definite defect management area 13. The case where the updating of the defect management information is not necessary or not possible is a case where the recording medium 10 is finalized, for example.

As shown in FIG. 1, the areal size in total of the temporary defect management areas 14A, 14B, and 14C is larger than that of the definite defect management area 13. Therefore, it is possible to record much defect management information in the temporary defect management areas 14A, 14B, and 14C. By this, it is possible to increase the number of times that the defect management information can be updated.

Namely, since the recording medium 10 is a write-once-type recording medium, it is impossible to overwrite the information. Thus, the defect management information is additionally recorded into the temporary defect management area every time the defect management information is updated. As a result, if the defect management information is updated several times, a plurality of pieces of defect management information individually remain in the temporary defect management area. Thus, in order to increase the number of times that the defect management information can be updated, it is necessary to increase the number of times that the defect management information can be additionally recorded. For that purpose, it is necessary to allow the additional or postscript recording of much defect management information, by increasing the areal size of the temporary defect management area. According to the embodiment, the areal size in total of the temporary defect management areas 14A, 14B, and 14C is large, so that it is possible to additionally record much defect management information, and thus, it is possible to increase the number of times that the defect management information can be updated.

Moreover, the temporary defect management area is divided into the three temporary defect management areas 14A, 14B, and 14C, and they are distributed and placed on the recording medium 10. By this, it is possible to reserve or ensure the temporary defect management area while the areas to record therein the record data and the control information are maintained. For example, even if the data area 11 and the control information recording area 12 are defined in the existing standard, it is possible to use space areas scattered on the recording medium (e.g. areas allowed to be freely used), as the temporary defect management areas 14A, 14B, and 14C. Incidentally, the number of the temporary defect management areas may be two or more.

On the other hand, the definite defect management area 13 is smaller than the temporary defect management areas 14A, 14B, and 14C, and the number thereof is one. This is because it is enough if one defect management information which is defined at the time of finalizing can be recorded into the definite defect management area 13. Incidentally, it may be constructed such that the definite defect management area is set to be somewhat large, or a plurality of definite defect management areas are provided, to thereby record the defined defect management information into the definite defect management area or areas, repeatedly, twice or more times. By this, it is possible to improve the robustness of the recording and the reproduction of the defect management information.

Moreover, the definite defect management area 13 is placed in the control information recording area 12. By this, it is possible to provide compatibility between the write-once-type recording medium 10 and a general rewritten-type recording medium.

Namely, the defect management information is a kind of control information. Therefore, it is desirable to record the defect management information into the area to record therein the control information, i.e. the control information recording area. Thus, it is desirable to place the defect management area in the control information recording area. Even in many rewritten-type recording media which are generally spread, the defect management area is placed in the control information recording area. Therefore, according to the embodiment, by placing the definite defect management area 13 in the control information recording area 12, and recording the defined defect management information into the definite defect management area 13, it is possible to provide the compatibility between the write-once-type recording medium 10 and the general rewritten-type recording medium. By this, it is possible to reproduce the data on the write-once-type recording medium 10 by using a drive apparatus for the general rewritten-type recording medium.

The status information recording area 15 is intended to record therein status information for indicating the recording status of one portion or each of the temporary defect management areas 14A, 14B, and 14C. By referring to the status information recorded in the status information recording area 15, it is possible to quickly specify and read the defect management information recorded at last in time (i.e. at the latest), out of the defect management information recorded in one portion or all of the temporary defect management areas 14A, 14B, and 14C. Incidentally, out of the defect management information recorded in one portion or all of the plurality of temporary defect management areas, the defect management information recorded at last in time is referred to as "last defect management information" hereinafter.

The last defect management information is the newest defect management information among the plurality of pieces of defect management information recorded on the recording medium 10. In order to perform the defect management by the recording apparatus and the reproducing apparatus for the write-once-type recording medium, it is necessary to search for and read the newest defect management information, i.e. the last defect management information, from the recording medium 10. As a method of searching for the last defect management information, there is a method of searching all of the temporary defect management areas 14A, 14B, and 14C. However, since the temporary defect management areas 14A, 14B, and 14C are distributed and placed on the recording medium 10, it takes time (e.g. a seek time) to search all of the temporary defect management areas 14A, 14B, and 14C. Thus, in the embodiment, the status information is recorded into the status information recording area 15 on the recording medium 10, one temporary defect management area in which the last defect management information is recorded is recognized on the basis of the status information, and only the one defect management area is searched. This makes it possible to search for the last defect management information in an extremely short time.

The specific content of the status information is not limited if it is information which allows the quick specification of the last defect management information. However, if the status information is information having the following content, it is possible to efficiently realize the quick specification of the last defect management information.

Namely, it is desirable that the status information includes information for indicating one temporary defect management area in which the defect management information recorded at last in time (i.e. the last defect management information) is recorded, out of the defect management information recorded in one portion or all of the plurality of temporary defect management areas. This aspect of the status information is referred to as a "first aspect", hereinafter.

Hereinafter, specific examples in which the last defect management information is read on the basis of the status information in the first aspect will be explained. FIG. 2 to FIG. 4 show a state in which the defect management information is additionally recorded onto the recording medium 10. Incidentally, for convenience of explanation, the display of the data area 11, the control information recording area 12, and the definite defect management area is omitted. The specific examples shown in FIG. 2 to FIG. 4 adopt a method in which every time the defect management information is updated, the updated defect management information is additionally recorded next to the previously recorded defect management information, continuously. Moreover, the specific examples shown in FIG. 2 to FIG. 4 adopt a method in which the defect management information is firstly recorded into the head of the temporary defect management area 14A, and then, recorded into the temporary defect management area 14B if the temporary defect management area 14A is filled up, and then, recorded into the temporary defect management area 14C if the temporary defect management area 14B is filled up. Moreover, each of the temporary defect management areas 14A, 14B, and 14C is filled up if three pieces of defect management information are recorded.

As shown in FIG. 2, if one defect management information 21 is recorded into the temporary defect management area 14A, the defect management information 21 is the last defect management information. In this case, the information for indicating the temporary defect management area 14A is recorded into the status information recording area 15 as the status information. By referring to the status information, it is possible to recognize the temporary defect management area 14A in which the last defect management information 21 is recorded. Then, only by searching the temporary defect management area 14A, it is possible to quickly specify and read the last defect management information 21. It is unnecessary to search the temporary defect management areas 14B and 14C.

As shown in FIG. 3, if three more defect management information 22 to 24 are recorded into the temporary defect management areas 14A and 14B, the defect management information 24 is the last defect management information. In this case, the information for indicating the temporary defect management area 14B is recorded into the status information recording area 15 as the status information. By referring to the status information, it is possible to recognize the temporary defect management area 14B in which the last defect management information 24 is recorded. Then, only by searching the temporary defect management area 14B, it is possible to quickly specify and read the last defect management information 24. It is unnecessary to search the temporary defect management areas 14A and 14C.

As shown in FIG. 4, if four more defect management information 25 to 28 are recorded into the temporary defect management areas 14B and 14C, the defect management information 28 is the last defect management information. In this case, the information for indicating the temporary defect management area 14C is recorded into the status information recording area 15 as the status information. By referring to the status information, it is possible to recognize the temporary defect management area 14C in which the last defect management information 28 is recorded. Then, only by searching the temporary defect management area 14C, it is possible to quickly specify and read the last defect management information 28. It is unnecessary to search the temporary defect management areas 14A and 14B.

Moreover, in place of the status information in the first state, the status information may be information having the following content. Namely, it may be constructed such that the status information includes information for indicating the presence or absence of an unrecorded area in one portion or each of the temporary defect management areas 14A, 14B, and 14C. Hereinafter, this aspect of the status information is referred to as a "second aspect".

Hereinafter, specific examples in which the last defect management information is read on the basis of the status information in the second aspect will be explained, with reference to FIG. 2 to FIG. 4.

As shown in FIG. 2, if one defect management information 21 is recorded into the temporary defect management area 14A, the defect management information 21 is the last defect management information. In this case, the information for indicating that there is an unrecorded area in each of the temporary defect management areas 14A, 14B, and 14C is recorded into the status information recording area 15 as the status information. If the order of recording the defect management information into the temporary defect management areas 14A, 14B, and 14C is known in advance, by referring to the status information, it is possible to recognize the temporary defect management area 14A in which the last defect management information 21 is recorded. Then, only by searching the temporary defect management area 14A, it is possible to quickly specify and read the last defect management information 21. It is unnecessary to search the temporary defect management areas 14B and 14C.

As shown in FIG. 3, if three more defect management information 22 to 24 are recorded into the temporary defect management areas 14A and 14B, the defect management information 24 is the last defect management information. In this case, the information for indicating that there is an unrecorded area in each of the temporary defect management areas 14B and 14C is recorded into the status information recording area 15 as the status information. If the order of recording the defect management information into the temporary defect management areas 14A, 14B, and 14C is known in advance, by referring to the status information, it is possible to recognize the temporary defect management area 14B in which the last defect management information 24 is recorded. Then, only by searching the temporary defect management area 14B, it is possible to quickly specify and read the last defect management information 24. It is unnecessary to search the temporary defect management areas 14A and 14C.

As shown in FIG. 4, if four more defect management information 25 to 28 are recorded into the temporary defect management areas 14B and 14C, the defect management information 28 is the last defect management information. In this case, the information for indicating that there is an unrecorded area only in the temporary defect management area 14C is recorded into the status information recording area 15 as the status information. If the order of recording the defect management information into the temporary defect management areas 14A, 14B, and 14C is known in advance, by referring to the status information, it is possible to recognize the temporary defect management area 14C in which the last defect management information 28 is recorded. Then, only by searching the temporary defect management area 14C, it is possible to quickly specify and read the last defect management information 28. It is unnecessary to search the temporary defect management areas 14A and 14B.

Incidentally, the specific examples in FIG. 2 to FIG. 4 adopt a method in which the defect management information is arranged sequentially from the head to the tail in each temporary defect management area. However, such a method may be adopted that the defect management information is arranged sequentially from the tail to the head in each temporary defect management area. Incidentally, the specific examples in FIG. 2 to FIG. 4 adopts a method in which the defect management information is additionally recorded in order of the temporary defect management areas 14A, 14B, and 14C. However, if the status information in the first aspect is used, it is not particularly necessary to determine the order of the temporary defect management areas to record therein the defect management information. Moreover, the specific examples in FIG. 2 to FIG. 4 adopt a method in which after one temporary defect management area is filled up, then the defect management information is recorded into the next temporary defect management area. However, if the status information in the first aspect is used, such a method may be adopted that every time one defect management information is recorded, the temporary defect management area to record it therein is changed, to thereby discretely record the plurality of defect management information in the plurality of temporary defect management areas.

As described above, according to the recording medium 10, it is possible to provide the compatibility between the write-once-type recording medium and the general rewritten-type recording medium while the defect management is realized. Moreover, it is possible to reserve the temporary defect management areas 14A, 14B, and 14C that are relatively large, and it is possible to increase the number of times that the defect management information can be updated. Moreover, it is possible to reserve the temporary defect management areas 14A, 14B, and 14C while the data area and the control information recording area are maintained. Furthermore, it is possible to quickly specify the last defect management information recorded in any one of the temporary defect management areas 14A, 14B, and 14C, on the basis of the status information.

Various Aspects of Write-once-type Recording Medium

Various aspects of the write-once-type recording medium of the present invention will be explained. As explained above, there is no limitation on the arrangement of the temporary defect management areas 14A, 14B, and 14C. However, as shown in FIG. 1, it is desirable that at least one of the temporary defect management areas 14A, 14B, and 14C is placed in the control information recording area 12.

Namely, since the defect management information is a kind of control information, it is desirable to record it into the control information recording area 12, originally. If so, it is desirable that at least one of the temporary defect management areas 14A, 14B, and 14C is placed in the control information recording area 12.

Moreover, it is desirable that at least one of the temporary defect management areas 14A, 14B, and 14C is placed between the control information recording area 12 and the data area 11.

Namely, as described above, the temporary defect management areas 14A, 14B, and 14C require a relatively large areal size. Therefore, for example, if all of the temporary defect management areas 14A, 14B, and 14C are placed in the control information recording area 12, there is no choice but to expand the control information recording area 12. The expansion of the control information recording area 12 causes such a disadvantage that it is difficult or impossible to provide the compatibility between the write-once-type recording medium 10 and the general rewritten-type recording medium. On the other hand, it is disadvantageous that the temporary defect management areas 14A, 14B, and 14C are placed in the data area 11. This is because the data area 11 is intended to record therein the record data, and not to record therein the control information. According to the embodiment, at least one of the temporary defect management areas 14A, 14B, and 14C is placed between the control information recording area 12 and the data area 11, so that the above-described disadvantage does not occur.

Moreover, there is no limitation on the arrangement of the status information recording area 15. However, since the status information is a kind of control information, it is desirable to record it in the control information recording area. Moreover, by recording the status information into the control information recording area, it is possible to continuously read the status information with other control information (without a big jump of an optical pickup), and it is possible to realize quick reading. Therefore, it is desirable to place the status information recording area 15 in the control information recording area 12.

First Embodiment of Recording Apparatus

Figure 5:
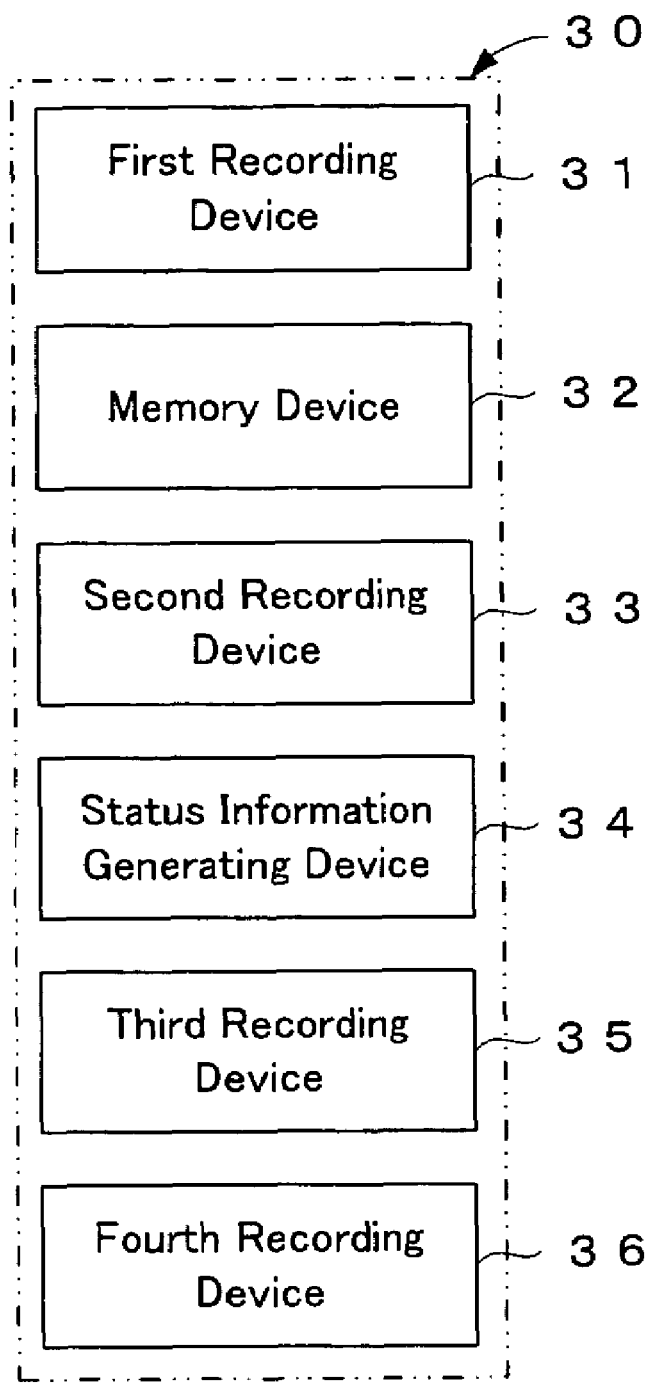
FIG. 5 is a block diagram showing a first embodiment of a recording apparatus of the present invention.

The first embodiment of the recording apparatus of the present invention will be explained. FIG. 5 shows the first embodiment of the recording apparatus of the present invention. A recording apparatus 30 shown in FIG. 5 is a recording apparatus for recording record data onto a write-once-type recording medium. The write-once-type recording medium is provided with: (i) a data area to record therein the record data; (ii) a control information recording area to record therein information for controlling an operation of recording and/or reading in the data area, the control information recording area including a definite defect management area to record therein defect management information of the data area; (iii) a plurality of temporary defect management areas to temporarily record therein the defect management information of the data area; and (iv) a status information recording area in which status information for indicating a recording status of one portion or each of the plurality of temporary defect management areas. For example, the recording apparatus 30 is an apparatus for recording the record data onto the above-described write-once-type recording medium 10.

As shown in FIG. 5, the recording apparatus 30 is provided with: a first recording device 31; a memory device 32; a second recording device 33; a status information generating device 34; a third recording device 35; and a fourth recording device 36.

The first recording device 31 records the record data into the data area. If the recording medium is an optical disc, the first recording device 31 can be realized by an optical pickup, a controller for controlling the optical pickup, and the like. Incidentally, the specific hardware structure of the first recording device 31 can be arbitrarily selected, depending on a recording method (light, magnetism, magneto-optics, phase-change, polarization direction of a dielectric substance, near-field light, or the like) adopted by the recording medium. For example, it may be a magnetic head or a probe.

The memory device 32 stores therein the defect management information. The memory device 32 can be realized by a memory and the like, for example.

The second recording device 33 records the record data stored in the memory device 32, into one of the plurality of temporary defect management areas. The specific hardware structure of the second recording device may be the same as that of the first recording device.

The status information generating device 34 generates the status information for indicating the recording status of one portion or each of the plurality of temporary defect management areas.

For example, the status information generating device 34 generates the status information including information for indicating one temporary defect management area in which the defect management information recorded at last in time is recorded, out of the defect management information recorded in one portion or all of the plurality of temporary defect management areas. The generation of such status information can be realized by recognizing, when the defect management information is recorded into any one of the plurality of temporary defect management areas, the recorded temporary defect management area, and extracting the recognition result as the information.

Moreover, in place of this, the status information generating device 34 may generate the status information including information for indicating the presence or absence of an unrecorded area in one portion or each of the plurality of temporary defect management areas. The generation of such status information can be realized by monitoring the recording of the defect management information, or by directly confirming the recording status of the temporary defect management area.

The third recording device 35 records the status information generated by the status information generating device 34, into the status information recording area. The specific hardware structure of the third recording device 35 may be the same as that of the first recording device 31.

The fourth recording device 36 records the defect management information stored in the memory device 32, into the definite defect management area. The specific hardware structure of the fourth recording device 36 may be the same as that of the first recording device 31.

Hereinafter, the operation of the recording apparatus 30 will be explained. The first recording device 31 records the record data into the data area on the write-once-type recording medium. On the other hand, if the defect management information including the defect list, which indicates the position of a defect on the write-once-type recording medium or the like, is generated, the memory device 32 stores the defect management information. The second recording device 33 records the defect management information stored in the memory device 32, into any one of the plurality of temporary defect management areas on the recording medium. There may be a variety of times when the second recording device 33 records the defect management information into the temporary defect management area. The conceivable times are, for example, immediately after the recording medium is initialized or formatted, immediately after a series of record data is recorded onto the recording medium, and the like. If the second recording device 33 records the defect management information into any one of the temporary defect management areas, the status information generating device 34 generates the status information for indicating the recording status of one portion or each of the temporary defect management areas at the present time point. Moreover, the third recording device 35 records the status information into the status information recording area on the recording medium. On the other hand, the fourth recording device 36 records the defect management information stored in the memory device 32, into the definite defect management area on the recording medium. There may be a variety of times when the fourth recording device 36 records the defect management information into the definite defect management area. The conceivable times are, for example, when the recording medium is finalized, and the like.

As described above, according to the recording apparatus 30, it is possible to realize the defect management and the recording of the record data, the defect management information, and the status information onto the write-once-type recording medium which has the compatibility with the general rewritten-type recording medium. Particularly, by generating and recording the status information, it is possible to realize the quick specification and reading of the last defect management information, at the next time of recording and reproduction.

Second Embodiment of Recording Apparatus

Figure 6:
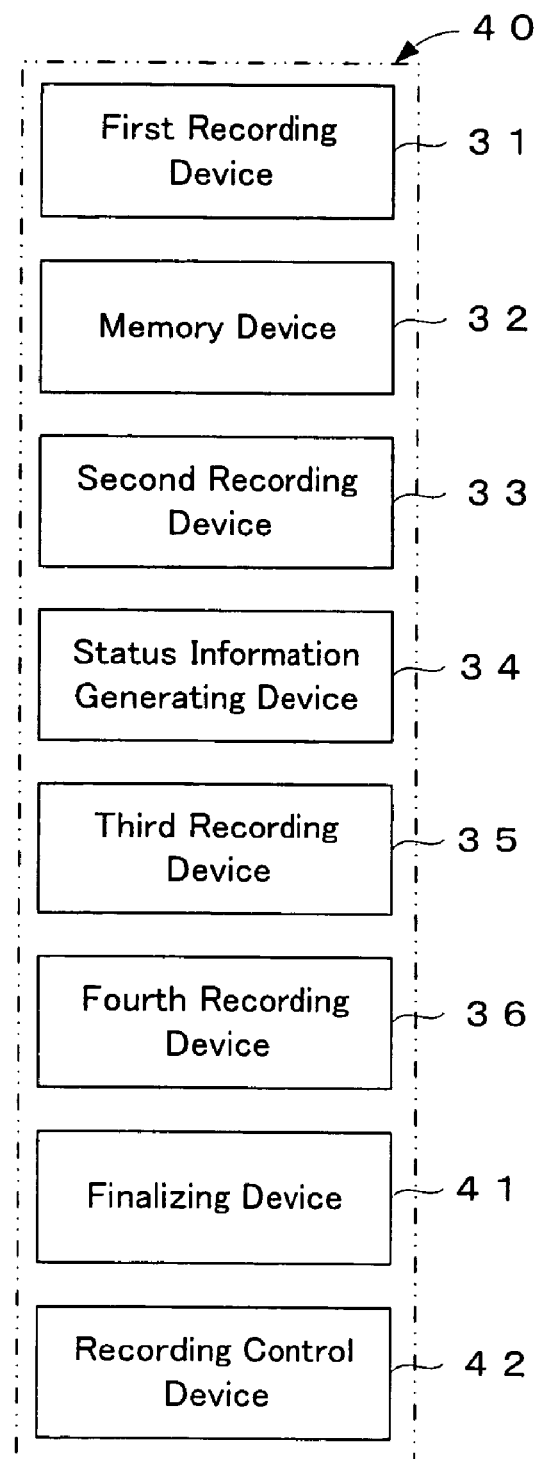
FIG. 6 is a block diagram showing a second embodiment of the recording apparatus of the present invention.

The second embodiment of the recording apparatus of the present invention will be explained. FIG. 6 shows the second embodiment of the recording apparatus of the present invention. As shown in FIG. 6, a recording apparatus 40 is provided with: the first recording device 31; the memory device 32; the second recording device 33; the status information generating device 34; the third recording device 35; and the fourth recording device 36, as with the recording apparatus 30. Moreover, the recording apparatus 40 is provided with: a finalizing device 41; and a recording control device 42.

The finalizing device 41 finalizes the write-once-type recording medium. In general, the finalizing is processing including an operation of arranging (or organizing) a recording format on the recording medium, after the recording of the record data onto the recording medium is completed. In general, the finalizing is performed in the case where the rewritten-type recording medium is made adapted to the recording format of a reproduce-only-type recording medium, or in a similar case. The finalizing on the recording apparatus 40 is processing to adapt the write-once-type recording medium to the recording format of the rewritten-type recording medium or the reproduce-only-type recording medium.

The recording control device 42 controls the second recording device 33 to record the defect management information into any one of the plurality of temporary defect management areas before the write-once-type recording medium is finalized, and controls the fourth recording device 36 to record the defect management information into the definite defect management area if the write-once-type recording medium is finalized by the finalizing device 41.

As described above, according to the recording apparatus 40, it is possible to record the defect management information into any one of the plurality of temporary defect management areas if the write-once-type recording medium is before the finalize, and it is possible to record the defect management information into the definite defect management area if the write-once-type recording medium is finalized by the finalizing device 41. By this, it is possible to establish the compatibility between the write-once-type recording medium and the general rewritten-type recording medium, with regard to the defect management information, if the write-once-type recording medium is finalized.

First Embodiment of Reproducing Apparatus

Figure 7:
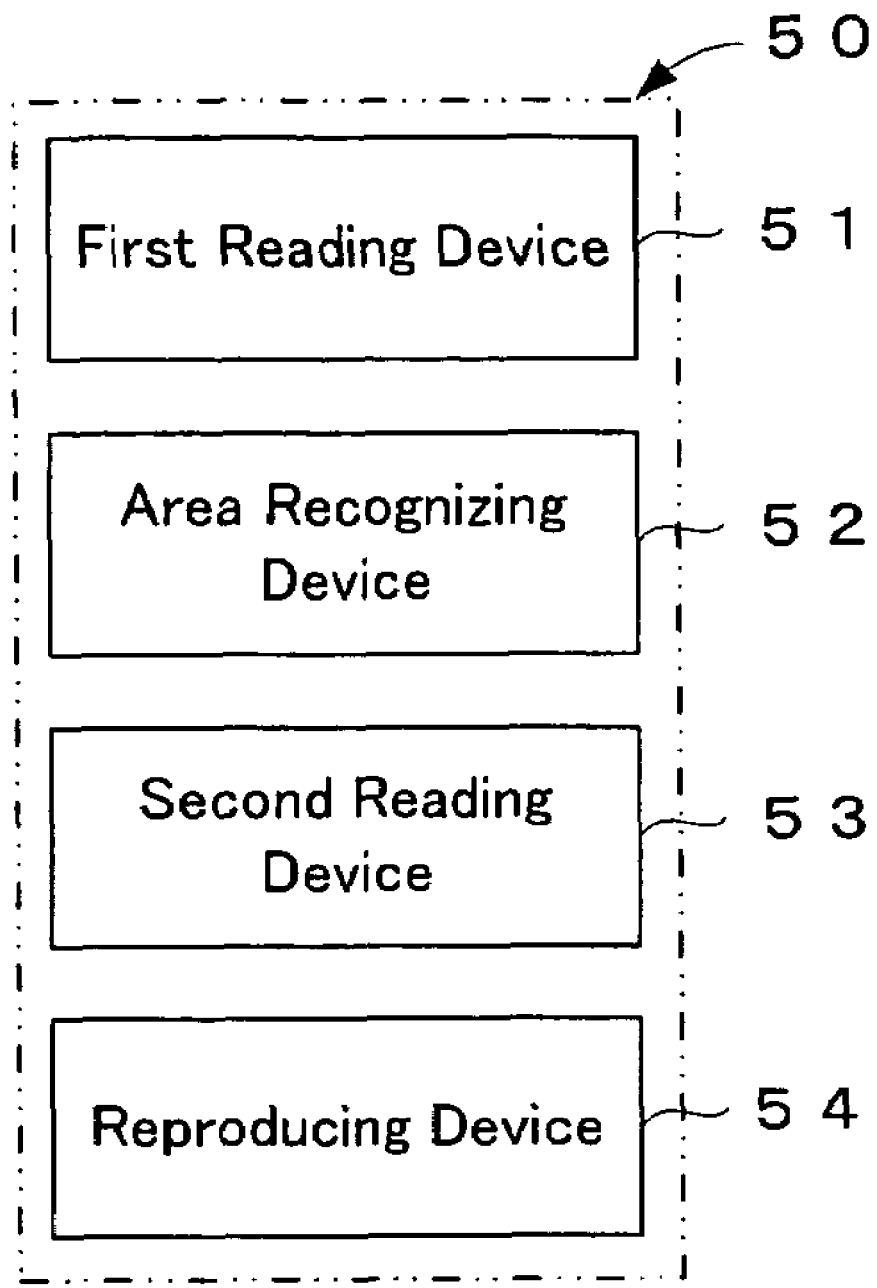
FIG. 7 is a block diagram showing a first embodiment of a reproducing apparatus of the present invention.

The first embodiment of the reproducing apparatus of the present invention will be explained. FIG. 7 shows the first embodiment of the reproducing apparatus of the present invention. A reproducing apparatus 50 shown in FIG. 7 is an apparatus for reproducing record data recorded on a write-once-type recording medium provided with: (i) a data area to record therein the record data; (ii) a control information recording area to record therein information for controlling an operation of recording and/or reading in the data area, the control information recording area including a definite defect management area to record therein defect management information of the data area; (iii) a plurality of temporary defect management areas to temporarily record therein the defect management information of the data area; and (iv) a status information recording area in which status information for indicating a recording status of one portion or each of the plurality of temporary defect management areas. For example, the reproducing apparatus 50 is an apparatus for reproducing the record data recorded on the above-described write-once-type recording medium 10.

As shown in FIG. 7, the reproducing apparatus 50 is provided with: a first reading device 51; an area recognizing device 52; a second reading device 53; and a reproducing device 54.

The first reading device 51 reads the status information recorded in the status information recording area on the recording medium. If the recording medium is an optical disc, the first reading device 51 can be realized by an optical pickup, a controller for controlling the optical pickup, and the like. Incidentally, the specific hardware structure of the first reading device 51 can be arbitrarily selected, depending on a recording method (light, magnetism, magneto-optics, phase-change, polarization direction of a dielectric substance, near-field light, or the like) adopted by the recording medium. For example, it may be a magnetic head or a probe.

The area recognizing device 52 recognizes one temporary defect management area in which the defect management information recorded at last in time (i.e. the last defect management information) is recorded, on the basis of the status information read by the first reading device 51.

For example, if the status information includes information for indicating the one temporary defect management area in which the defect management information recorded at last in time (i.e. the last defect management information) is recorded, out of the defect management information recorded in one portion or all of the plurality of temporary defect management areas, the area recognizing device 52 recognizes the one temporary defect management area which includes the last defect management information, on the basis of this information for indicating the one temporary defect management area.

Moreover, if the status information includes information for indicating the presence or absence of an unrecorded area in one portion or each of the plurality of temporary defect management areas, the area recognizing device 52 recognizes the one temporary defect management area which includes the last defect management information, on the basis of this information indicating the presence or absence.

The second reading device 53 reads the defect management information recorded in the one temporary defect management area specified by the area recognizing device 52. The specific hardware structure of the second reading device 53 may be the same as that of the first reading device 51.

The reproducing device 54 reproduces the record data recorded in the data area, on the basis of the defect management information read by the second reading device 53. The reproducing device 54 is provided with a record data reading device for reading the record data recorded in the data area. The specific hardware structure of the record data reading device may be the same as that of the first reading device 51. Moreover, if the record data is image data, the reproducing device 54 is provided with a decoder for converting the image data to an image signal which can be displayed on a display.

Hereinafter, the operation of the reproducing apparatus 50 will be explained. For example, if the write-once-type recording medium on which the record data is already recorded and which is not finalized is inserted or mounted on the reproducing apparatus 50, the first reading device 51 reads the status information recorded in the status information recording area on the recording medium. Then, the area recognizing device 52 recognizes one temporary defect management area in which the last defect management information is recorded, from among the plurality of temporary defect management areas existing on the recording medium, on the basis of the status information read by the first reading device 51. Then, the second reading device 53 reads the last defect management information recorded in the one temporary defect management area. Then, the reproducing device 54 reads and reproduces the record data recorded in the data area on the recording medium, while the performing the defect management on the basis of the last defect management information.

As described above, according to the reproducing apparatus 50, it can quickly specify and quickly read the last defect management information, on the basis of the status information. By this, it is possible to quickly perform the defect management processing and the reproduction processing.

Second Embodiment of Reproducing Apparatus

Figure 8:
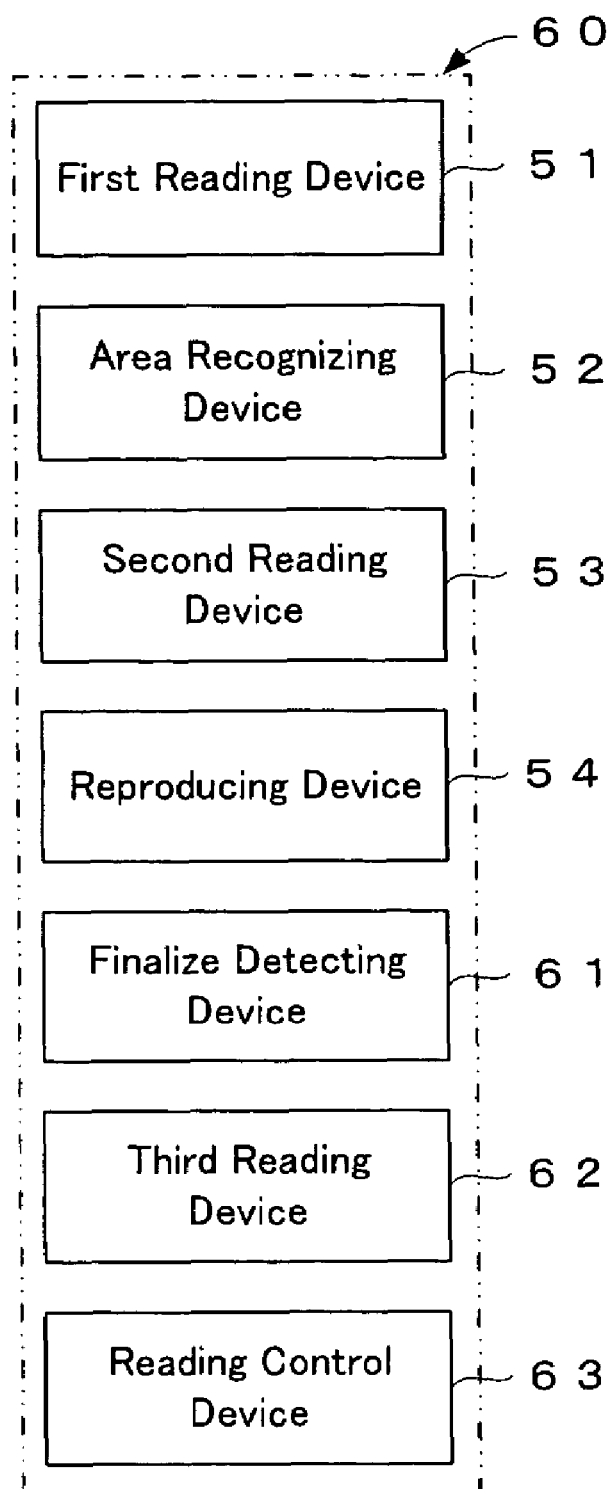
FIG. 8 is a block diagram showing a second embodiment of the reproducing apparatus of the present invention.

The second embodiment of the reproducing apparatus of the present invention will be explained. FIG. 8 shows the second embodiment of the reproducing apparatus of the present invention.

As shown in FIG. 8, a reproducing apparatus 60 is provided with: the first reading device 51; the area recognizing device 52; the second reading device 53; and the reproducing device 54, as with the reproducing apparatus 50. Moreover, the reproducing apparatus 60 is provided with: a finalize detecting device 61; a third reading device 62; and a reading control device 63.

The finalize detecting device 61 detects whether or not the write-once-type recording medium is already finalized. It is possible to detect whether or not the write-once-type recording medium is already finalized, by referring to the information recorded in the control information recording area or the like on the write-once-type recording medium, for example.

The third reading device 62 reads the defect management information recorded in the definite defect management area. The specific hardware structure of the third reading device 62 may be the same as that of the first reading device 51.

The reading control device 63 controls the third reading device 62 to read the defect management information recorded in the definite defect management area if the write-once-type recording medium is already finalized, and controls the second reading device 53 to read the defect management information recorded in the one temporary defect management area in which the last defect management information is recorded if the write-once-type recording medium is not finalized, on the basis of a detection result by the finalize detecting device 61.

As described above, according to the reproducing apparatus 60, it is possible to read the defect management information recorded in the definite defect management area if the write-once-type recording medium is already finalized, and it is possible to read the last defect management information recorded in any one of the temporary defect management areas if the write-once-type recording medium is not finalized. By this, it is possible to always read the newest defect management information and perform the defect management on the basis of the newest defect management information.

Incidentally, the embodiments described above may be realized in an integral form with hardware as an exclusive apparatus or may be realized by making a computer read a program.

Embodiment of Recording Method

The embodiment of the recording method of the present invention will be explained. The recording method is a method of recording record data onto a write-once-type recording medium provided with: (i) a data area to record therein the record data; (ii) a control information recording area to record therein information for controlling an operation of recording and/or reading in the data area, the control information recording area including a definite defect management area to record therein defect management information of the data area; (iii) a plurality of temporary defect management areas to temporarily record therein the defect management information of the data area; and (iv) a status information recording area in which status information for indicating a recording status of one portion or each of the plurality of temporary defect management areas. For example, the recording method in the embodiment of the present invention is a method of recording the record data onto the above-described recording medium 10.

The recording method in the embodiment of the present invention is provided with: a first recording process of recording the record data into the data area; a defect management information generating process of generating or updating the defect management information; a second recording process of recording the defect management information generated or updated in the defect management information generating process, into any one of the plurality of temporary defect management areas; a status information generating process of generating the status information for indicating the recording status of one portion or each of the plurality of temporary defect management areas; a third recording process of recording the status information generated in the status information generating process, into the status information recording area; a finalizing process of finalizing the write-once-type recording medium; and a fourth recording process of recording the defect management information generated or updated in the defect management information generating process, into the definite defect management area, if the finalizing is performed in the finalizing process.

In the recording method, at a stage before the recording medium is finalized, the defect management information is recorded any one of the plurality of temporary defect management areas. Then, the status information for indicating the recording status of one portion or each of the plurality of temporary defect management areas at the present stage, is generated. Then, the status information is recorded into the status information recording area. By this, next time when the recording or the reproduction is performed with respect to the recording medium, it is possible to quickly specify and quickly read the last defect management information, on the basis of the status information recorded on the recording medium.

Embodiment of Reproducing Method

The embodiment of the reproducing method of the present invention will be explained. The reproducing method is a method of reproducing record data recorded on a write-once-type recording medium provided with: (i) a data area to record therein the record data; (ii) a control information recording area to record therein information for controlling an operation of recording and/or reading in the data area, the control information recording area including a definite defect management area to record therein defect management information of the data area; (iii) a plurality of temporary defect management areas to temporarily record therein the defect management information of the data area; and (iv) a status information recording area in which status information for indicating a recording status of one portion or each of the plurality of temporary defect management areas. For example, the reproducing method in the embodiment of the present invention is a method of reproducing the record data recorded on the above-described recording medium 10.

The reproducing method in the embodiment of the present invention is provided with: a finalize detecting process of detecting whether or not the write-once-type recording medium is already finalized; a first reading process of reading the defect management information recorded in the definite defect management area and of storing the defect management information into a memory device, if the write-once-type recording medium is already finalized; a second reading process of reading the status information recorded in the status information recording area, if the write-once-type recording medium is not finalized; an area recognizing process of specifying one temporary defect management area in which the defect management information recorded at last in time is recorded, on the basis of the status information read in the first reading process; a third reading process of reading the defect management information recorded in the one temporary defect management area recognized in the area recognizing process; and a reproducing process of reproducing the record data recorded in the data area, on the basis of the defect management information read in the third reading process.

In the reproducing method, the status information is read if the recording medium is not finalized, and the one temporary defect management area in which the last defect management information is recorded is recognized on the basis of the status information. Then, the last defect management information recorded in the one temporary defect management area is read. Then, the record data is reproduced, on the basis of the last defect management information. According to the recording method, it is possible to recognize the one temporary defect management area in which the last defect management information is recorded, from among the plurality of temporary defect management areas existing on the recording medium, on the basis of the status information, and it is possible to read the last defect management information.

EXAMPLES

First Example of Write-once-type Recording Medium

Figure 9:
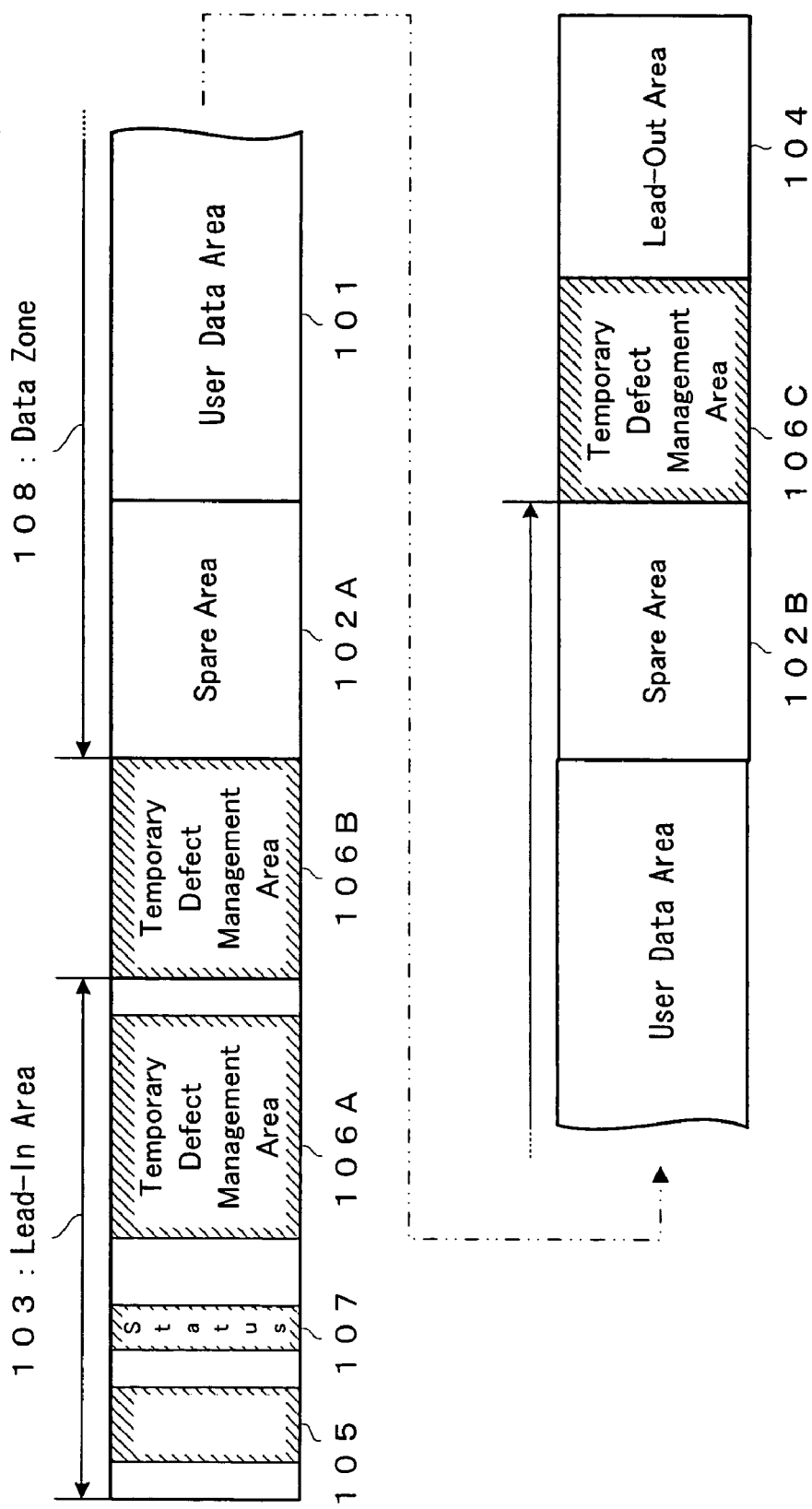
FIG. 9 is a block diagram showing a first example of the write-once-type recording medium of the present invention.

The first example of the write-once-type recording medium of the present invention will be explained. In the first example, the write-once-type recording medium of the present invention is applied to a one-layer write-once-type optical disc. FIG. 9 shows the record structure of a write-once-type optical disc 100. The upper left side of FIG. 9 is the inner circumferential side of the optical disc 100, and the lower right side is the outer circumferential side of the optical disc 100.

As shown in FIG. 9, the optical disc 100 is provided with: a user data area 101; spare areas 102A and 102B; a lead-in area 103; a lead-out area 104; a definite defect management area 105; temporary defect management areas 106A, 106B, and 106C; and a status information recording area 107.

The user data area 101, and the spare areas 102A and 102B are intended to record therein the record data. The user data area 101 is a main area to record therein the record data. The spare areas 102A and 102B are intended to evacuate the record data thereto from a defect in the user data area 101. Namely, if there is a defect in the user data area 101, the record data to be recorded or already recorded at the position of the defect is recorded into the spare area 102A or 102B. The spare area 102A is placed on the inner circumferential side of the user data area 101, and the spare area 102B is placed on the outer circumferential side of the user data area 101. A data zone 108 is formed from the user data area 101 and the spare areas 102A and 102B.

The lead-in area 103 and the lead-out area 104 are intended to record therein the control information. The lead-in area 103 is placed on the most inner circumferential side of the optical disc 100. The lead-out area 105 is placed on the most outer circumferential side of the optical disc 100.

The definite defect management area 105 is intended to definitely record therein the defect management information. When the optical disc 100 is finalized, the defect management information is recorded into the definite defect management area 105. The definite defect management area 105 is placed in the lead-in area 103.

The temporary defect management areas 106A, 106B, and 106C are intended to temporarily record therein the defect management information. At a stage before the optical disc 100 is finalized, the defect management information is recorded into any one of the temporary defect management areas 106A, 106B, and 106C. There are three temporary defect management areas on the optical disc 100. The first temporary defect management area 106A is placed in the lead-in area 103. The second temporary defect management area 106B is placed between the lead-in area 103 and the data zone 108. The third temporary defect management area 106C is placed between the data zone 108 and the lead-out area 104.

The status information recording area 107 is intended to record therein the status information. The status information recording area 107 is placed in the lead-in area 103.

As described above, according to the optical disc 100, the definite defect management area 105 is placed in the lead-in are 103. By this, it is possible to provide the compatibility between the optical disc 100 and the general rewritten-type recording medium, and at the same time, it is possible to realize the defect management for the optical disc 100.

Moreover, the temporary defect management area 106B is placed between the lead-in are 103 and the data zone 108, and the temporary defect management area 106C is placed between the data zone 108 and the lead-out area 104. Thus, it is possible to provide the compatibility between the optical disc 100 and the general rewritten-type recording medium, and at the same time, it is possible to provide the relatively large temporary defect management area. By this, it is possible to increase the number of times that the defect management information can be updated.

Moreover, the temporary defect management area is divided into the three temporary defect management areas 106A, 106B, and 106C, and they are distributed and placed on the optical disc 100. Thus, it is possible to provide the temporary defect management areas having a relatively large areal size, without greatly change the existing record structure as for the optical disc. By this, it is possible to increase the number of times that the defect management information can be updated.

Incidentally, the number of the temporary defect management areas is not limited to three; it may be two, and it maybe four or more. Moreover, there is no limitation on the arrangement of the temporary defect management areas. Furthermore, the temporary defect management area may be placed on the outer circumferential side of the lead-out area.

Second Example of Write-once-type Recording Medium

Figure 10:
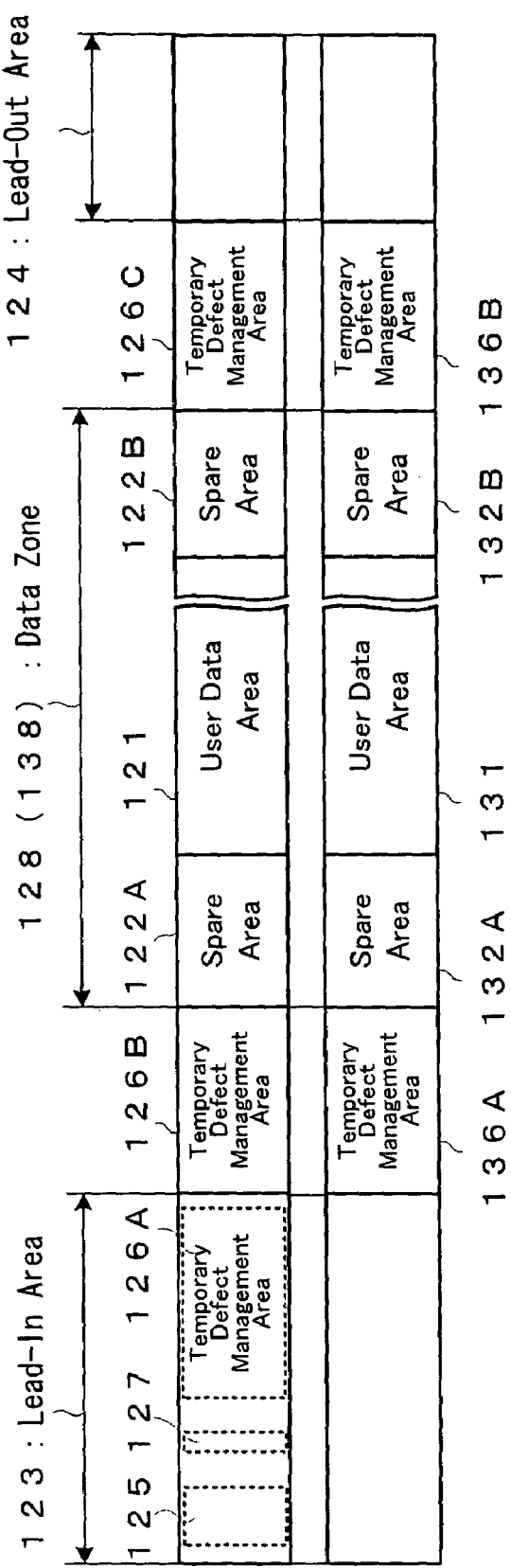
FIG. 10 is a block diagram showing a second example of the write-once-type recording medium of the present invention.

The second example of the write-once-type recording medium of the present invention will be explained. In the second example, the write-once-type recording medium of the present invention is applied to a two-layer write-once-type optical disc. FIG. 10 shows the record structure of a write-once-type optical disc 120. The left side of FIG. 10 is the inner circumferential side of the optical disc 120, and the right side is the outer circumferential side of the optical disc 120.

As shown in FIG. 10, a first layer of the optical disc 120 is provided with: a user data area 121; spare areas 122A and 122A; a lead-in area 123; a lead-out area 124; a definite defect management area 125; temporary defect management areas 126A, 126B, and 126C; and a status information recording area 127. A data zone 128 is formed from the user data area 121 and the spare areas 122A and 122B. A second layer of the optical disc 120 is provided with: a user data area 131; spare areas 132A and 132B; and temporary defect management areas 136A and 136B. A data zone 138 is formed from the user data area 131 and the spare areas 132A and 132B.

Even by virtue of the optical disc 120 having such a structure, it is possible to achieve the same operational effect as in the optical disc 100.

Example of Defect Management Information

Figures 11, 12:
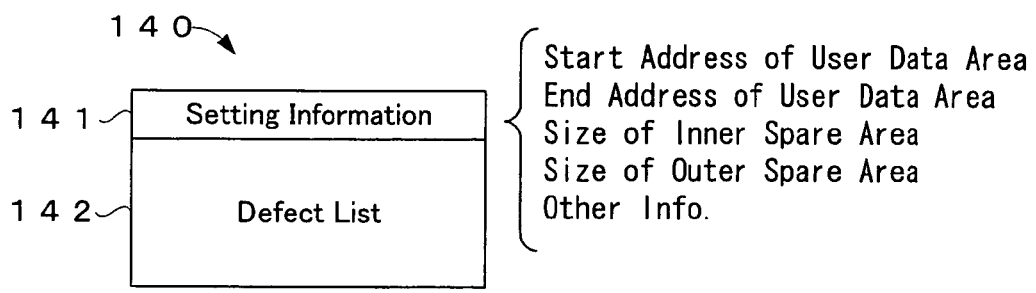
FIG. 11 is an explanatory diagram showing an example of the defect management information.
FIG. 12 is an explanatory diagram showing an example of a defect list.

The example of the defect management information of the write-once-type recording medium of the present invention will be explained. FIG. 11 shows the defect management information for the optical disc 100. As shown in FIG. 11, defect management information 140 includes setting information 141 and a defect list 142. The setting information 141 includes: the start address of the user data area 101; the end address of the user data area 101; the size of the inner spare area 102A; the size of the outer spare area 102B; and other information.

The position and size of the user data area 101 on the optical disc 100 are determined on the basis of the setting information 141. Moreover, the size and position of each of the spare areas 102A and 102B are also determined on the basis of the setting information 141. The setting information 141 is generated by a recording/reproducing apparatus at the time of initializing the optical disc 100, and recorded onto the optical disc 100, as one portion of the defect management information 140. Therefore, the position and size of the data zone 108 can be arbitrarily set by the recording/reproducing apparatus. For example, by adjusting the start address of the user data area 101, or the size of the spare area 102A, it is possible to form an area between the lead-in area 103 and the data zone 108, and use the area as the temporary defect management area 106B.

FIG. 12 shows the content of the defect list 142. As shown in FIG. 12, on the defect list 142, there are recorded an address for indicating the position of a defect in the user data area 101 (which is hereinafter referred to as a "defect address"), an address for indicating the recording position in the partial spare area 102A or 102B of the record data to be recorded or already recorded at the position of the defect (which is hereinafter referred to as a "spare address" (i.e. "spare recording address")); and other information. If there are a plurality of defects in the user data area 101, a plurality of defect addresses corresponding to the defects and a plurality of spare addresses are recorded onto the defect list 142. If the record data recorded on the optical disc 100 is reproduced, the recording/reproducing apparatus refers to the defect address and the spare address of the defect list 142. By referring to the defect list 142, it is possible to follow a locus or path of the recording of the record data which is recorded away from the defect, and it is possible to certainly reproduce the record data.

First Example of Status Information

The first example of the status information of the write-once-type recording medium of the present invention will be explained. FIG. 13 shows the first example of the status information for the optical disc 100. Status information 150 shown in FIG. 13 indicates the recording statuses of the temporary defect management areas 106A, 106B, and 106C. The status information 150 includes: information for indicating the start address of each of the temporary defect management areas 106A, 106B, and 106C; information for indicating the areal size of each of them; and a last defect management information flag. Incidentally, it is also possible to replace the information for indicating the areal size of each of the temporary defect management areas 106A, 106B, and 106C, by information for indicating the end address of each of the temporary defect management areas 106A, 106B, and 106C.

The last defect management information flag indicates the temporary defect management area in which the last defect management information is recorded, out of the temporary defect management areas 106A, 106B, and 106C. The last defect management information flag is 3 bit data. The bit 0 of the last defect management information flag corresponds to the temporary defect management area 106A. The bit 1 thereof corresponds to the temporary defect management area 106B. The bit 2 thereof corresponds to the temporary defect management area 106C.

In the last defect management information flag, if the bit is "0", that means there is no last defect management information in the temporary defect management area corresponding to the bit. If the bit is "1", that means there is the last defect management information in the temporary defect management area corresponding to the bit. Incidentally, the last defect management information is the defect management information recorded at last in time, out of the defect management information recorded in one portion or all of the plurality of temporary defect management areas, as described above.

Hereinafter, the function of the status information 150 will be explained, specifically. FIG. 14 shows a status in which four pieces of defect management information are recorded in the temporary defect management area on the optical disc 100 and four pieces of status information are recorded in the status information recording area 107. Incidentally, in FIG. 14, the display of the lead-in area 103, the data zone 108, and the like is omitted, for convenience of explanation.

In FIG. 14, defect management information 140A is the defect management information generated at first. This is recorded at the head of the first temporary defect management area 106A. Defect management information 140B is the defect management information updated for the first time. This is continuously recorded next to the defect management information 140A. Defect management information 140C is the defect management information updated for the second time. The defect management information 140A is full of the three defect management information, and there is no more unrecorded are in which the defect management information can be recorded. Defect management information 140D is the defect management information updated for the third time. This is recorded at the head of the temporary defect management area 106B. In FIG. 14, the defect management information 140D is the last defect management information.

On the other hand, in FIG. 14, status information 150A is the status information corresponding to the defect management information 140A. This is recorded substantially at the same time of recording the defect management information 140A, and is recorded at the head of the status information recording area 107. Status information 150B is the status information corresponding to the defect management information 140B. This is recorded substantially at the same time of recording the defect management information 140B, and is continuously recorded next to the status information 150A. In the same manner, status information 150C is the status information corresponding to the defect management information 140C, and status information 150D is the status information corresponding to the defect management information 140D. In FIG. 14, the status information 150D corresponds to the last defect management information 140D. Hereinafter, the status information corresponding to the last defect management information is referred to as "last status information".

The status information 150D shown in FIG. 13 shows the recording status of the optical disc 100 shown in FIG. 14. Namely, the status information 150 is the last status information 150D in FIG. 14. In the status information 150 (150D), the bit 1 is "1", out of the bits of the last defect management information flag. This indicates that the last defect management information 140D is recorded in the temporary defect management area 106B corresponding to the bit 1.

When the record data is recorded onto the optical disc 100, or when the record data recorded on the optical disc 100 is reproduced, the recording/reproducing apparatus reads the defect management information from the optical disc 100, at a preparation stage before starting the recording and the reproduction of the record data. Then, the recording/reproducing apparatus performs the defect management, on the basis of the read defect management information. Moreover, the recording/reproducing apparatus updates the defect management information on the basis of the read defect management information. As described above, the defect management information read by the recording/reproducing apparatus at the preparation state of the recording and the reproduction is the basis of the defect management and the basis of the updating of the defect management information. Thus, it is desirable that the defect management information is the newest defect management information, i.e., the last defect management information, in which the status of a defect on the optical disc 100 at the present time point is reflected at most. Thus, the recording/reproducing apparatus specifies and reads the last defect management information, from among the plurality of defect management information recorded in the temporary defect management areas 106A, 106B, and 106C on the optical disc 100, at the preparation stage of the recording and the reproduction. At this time, the recording/reproducing apparatus refers to the last defect management information flag of the status information 150. By this, the recording/reproducing apparatus can recognize the temporary defect management area in which the last defect management information is recorded, and can quickly specify the last defect management information. For example, if the recording status of the optical disc 100 is as shown in FIG. 14, the recording/reproducing apparatus recognizes that the bit 1 of the last defect management information flag of the status information 150D is "1". Then, on the basis of the recognition, the recording/reproducing apparatus searches only the temporary defect management area 106B. The recording/reproducing apparatus does not search the temporary defect management areas 106A and 106C. By this, the recording/reproducing apparatus cam quickly specify the last defect management information 140D.

Second Example of Status Information

The second example of the status information of the write-once-type recording medium of the present invention will be explained. FIG. 15 shows the second example of the status information for the optical disc 100. Status information 160 shown in FIG. 15 indicates the recording statuses of the temporary defect management areas 106A, 106B, and 106C. The status information 160 includes: the information for indicating the start address of each of the temporary defect management areas 106A, 106B, and 106C; the information for indicating the areal size of each of them; and a full flag.

The full flag indicates the presence or absence of an unrecorded area in each of the temporary defect management areas 106A, 106B, and 106C. The full flag is 3 bit data. The bit 0 of the full flag corresponds to the temporary defect management area 106A. The bit 1 thereof corresponds to the temporary defect management area 106B. The bit 2 thereof corresponds to the temporary defect management area 106C.

In the full flag, if the bit is "0", that means there is an unrecorded area in the temporary defect management area corresponding to the bit. If the bit is "1", that means there is no unrecorded area in the temporary defect management area corresponding to the bit.

Hereinafter, the function of the status information 160 will be explained, specifically, with reference to FIG. 14 and FIG. 15. The status information 160 shown in FIG. 15 shows the recording status of the optical disc 100 shown in FIG. 14. In the status information 160, the bit 0 is "1", and the bit 1 and the bit 2 are both "0", out of the bits of the full flag. This indicates that there is no unrecorded area in the defect management information 140A corresponding to the bit 0, and that there is unrecorded areas in the temporary defect management areas 106B and 106C. Here, it is assumed that the order of the temporary defect management areas which are used for the additional recording of the defect management information is determined in advance to be 106A→106B→106C. Namely, it is assumed that the following rule is set in advance to the recording/reproducing apparatus; i.e., the defect management information is firstly recorded into the temporary defect management area 106A, and then, recorded into the temporary defect management area 106B if the temporary defect management area 106A is filled up, and then, recorded into the temporary defect management area 106C if the temporary defect management area 106B is filled up. Under this condition, if there is no unrecorded area only in the temporary defect management area 106A, that means the last defect management information is recorded in the next temporary defect management area 106B. Thus, by referring to the status information 160, the recording/reproducing apparatus can recognize the temporary defect management area in which the last defect management information is recorded, and can quickly specify the last defect management information.

Third Example of Status Information

The third example of the status information of the write-once-type recording medium of the present invention will be explained. FIG. 16 shows the third example of the status information for the optical disc 100. Status information 170 shown in FIG. 16 indicates the recording statuses of the temporary defect management areas 106A, 106B, and 106C. The status information 170 includes: the information for indicating the start address of each of the temporary defect management areas 106A, 106B, and 106C; the information for indicating the areal size of each of them; and a recording status flag.

The recording status flag indicates whether each of the defect management areas 106A, 106B, and 106C is all unrecorded, partially recorded, or all recorded. The recording status flag is 6 bit data. The bit 0 and the bit 1 of the recording status flag correspond to the temporary defect management area 106A. The bit 2 and the bit 3 thereof correspond to the temporary defect management area 106B. The bit 4 and the bit 5 thereof correspond to the temporary defect management area 106C. As described above, in the recording status flag, 2 bit corresponds to one temporary defect management area. Hereinafter, the 2 bit corresponding to one temporary defect management area is referred to a "bit unit".

In the recording status flag, if the bit unit is "00", that means the temporary defect management area corresponding to the bit unit is all unrecorded. If the bit unit is "01", that means the temporary defect management area corresponding to the bit unit is partially recorded. If the bit unit is "10", that means the temporary defect management area corresponding to the bit unit is all recorded.

Hereinafter, the function of the status information 170 will be explained, specifically. FIG. 17 shows a status in which four pieces of defect management information are recorded in the temporary defect management area on the optical disc 100 and four pieces of status information are recorded in the status information recording area 107.

In FIG. 17, the defect management information 140A generated at first, the defect management information 140B updated for the first time, and the defect management information 140C updated for the second time, are recorded in the defect management area 106A. Moreover, the defect management information 140D updated for the third time is recorded in the temporary defect management area 106C. On the other hand, status information 170A to 170D corresponding to the defect management information 140A to 140D, respectively, are recorded in the status information recording area 107. In FIG. 17, the defect management information 140D is the last defect management information, and the status information 170D is the last status information.

The status information 170 shown in FIG. 16 shows the recording status of the optical disc 100 shown in FIG. 17. Namely, the status information 170 is the last status information 170D in FIG. 17. In the status information 170 (170D), the bit unit provided with the bit 4 and the bit 5 is "01", out of the bit units of the recording status flag. This indicates that the temporary defect management area 106C corresponding to the bit unit is partially recorded, and that the temporary defect management area 106C is in use now. This means that the last defect management information 140D is recorded in the temporary defect management area 106C. Thus, by referring to the status information 170, the recording/reproducing apparatus can recognize the temporary defect management area in which the last defect management information 140D is recorded, and can quickly specify the last defect management information 140D.

Fourth Example of Status Information

The fourth example of the status information of the write-once-type recording medium of the present invention will be explained. FIG. 18 shows the fourth example of the status information for the optical disc 100. Status information 180 shown in FIG. 18 indicates the recording statuses of the temporary defect management areas 106A, 106B, and 106C. The status information 180 includes: the information for indicating the start address of each of the temporary defect management areas 106A, 106B, and 106C; the information for indicating the areal size of each of them; and a use status flag.

The use status flag indicates whether each of the defect management areas 106A, 106B, and 106C is active or inactive. If it is active, the use status flag also indicates whether or not each of the defect management areas 106A, 106B, and 106C is in use. Incidentally, the "active" indicates a status in which the use of the temporary defect management area is predetermined or scheduled, allowed, or can be performed. The "inactive" indicates a status in which the use of the temporary defect management area is not predetermined, not allowed, or can not be performed. For example, if the temporary defect management area 106C is used for another application, the temporary defect management area 106C is made inactive.

The use status flag is 6 bit data. The bit 0 and the bit 1 of the use status flag correspond to the temporary defect management area 106A. The bit 2 and the bit 3 thereof correspond to the temporary defect management area 106B. The bit 4 and the bit 5 thereof correspond to the temporary defect management area 106C. As described above, in the use status flag, 2 bit corresponds to one temporary defect management area. Hereinafter, the 2 bit corresponding to one temporary defect management area is referred to a "bit unit".

In the use status flag, if the bit unit is "00", that means the temporary defect management area corresponding to the bit unit is active, and is not in use now. If the bit unit is "01", that means the temporary defect management area corresponding to the bit unit is active, and in use now. If the bit unit is "10", that means the whole temporary defect management area corresponding to the bit unit is inactive.

Hereinafter, the function of the status information 180 will be explained, specifically. FIG. 19 shows a status in which four pieces of defect management information are recorded in the temporary defect management area on the optical disc 100 and four pieces of status information are recorded in the status information recording area 107.

In FIG. 19, the defect management information 140A generated at first, the defect management information 140B updated for the first time, and the defect management information 140C updated for the second time, are recorded in the defect management area 106A. Moreover, the defect management information 140D updated for the third time is recorded in the temporary defect management area 106B. On the other hand, status information 180A to 180D corresponding to the defect management information 140A to 140D, respectively, are recorded in the status information recording area 107. In FIG. 19, the defect management information 140D is the last defect management information, and the status information 180D is the last status information.

The status information 180 shown in FIG. 18 shows the recording status of the optical disc 100 shown in FIG. 19. Namely, the status information 180 is the last status information 180D in FIG. 19. In the status information 180 (180D), the bit unit provided with the bit 2 and the bit 3 is "01", out of the bit units of the use status flag. This indicates that the temporary defect management area 106B corresponding to the bit unit is active, and in use now. This means that the last defect management information 140D is recorded in the temporary defect management area 106B. Thus, by referring to the status information 180, the recording/reproducing apparatus can recognize the temporary defect management area in which the last defect management information 140D is recorded, and can quickly specify the last defect management information 140D.

Example of Recording Apparatus•Reproducing Apparatus

Figure 20:
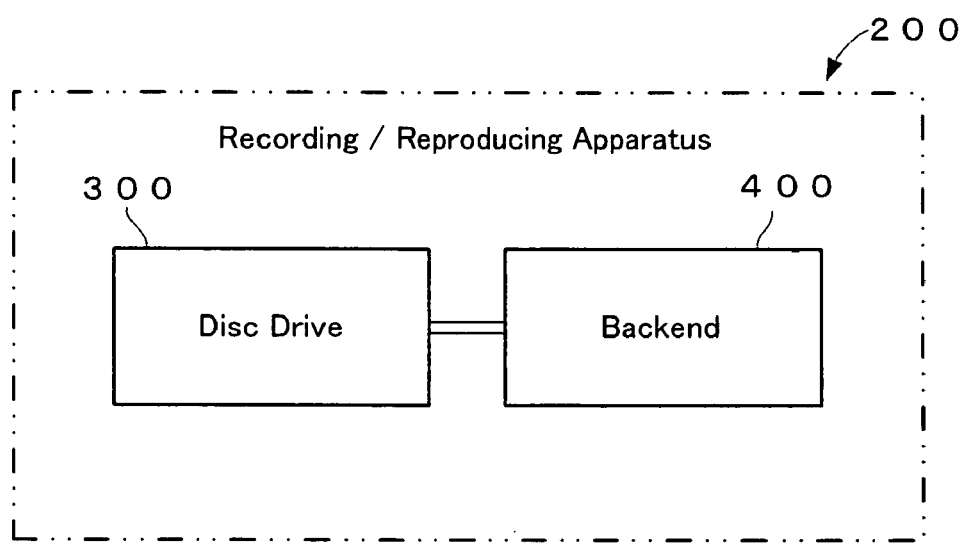
FIG. 20 is a block diagram showing a recording/reproducing apparatus, which has functions of the recording apparatus and the reproducing apparatus of the present invention.

The example of the recording apparatus and the reproducing apparatus of the present invention will be explained. FIG. 20 shows the example of the recording apparatus and the reproducing apparatus of the present invention. A recording/reproducing apparatus 200 shown in FIG. 20 is provided with: a function as a recording apparatus of recording the record data onto the optical disc 100; and a function as a reproducing apparatus of reproducing the record data recorded on the optical disc 100.

At first, the structure of the recording/reproducing apparatus 200 will be explained. As shown in FIG. 20, the recording/reproducing apparatus 200 is provided with: a disc drive 300; and a backend 400.

Figure 21:
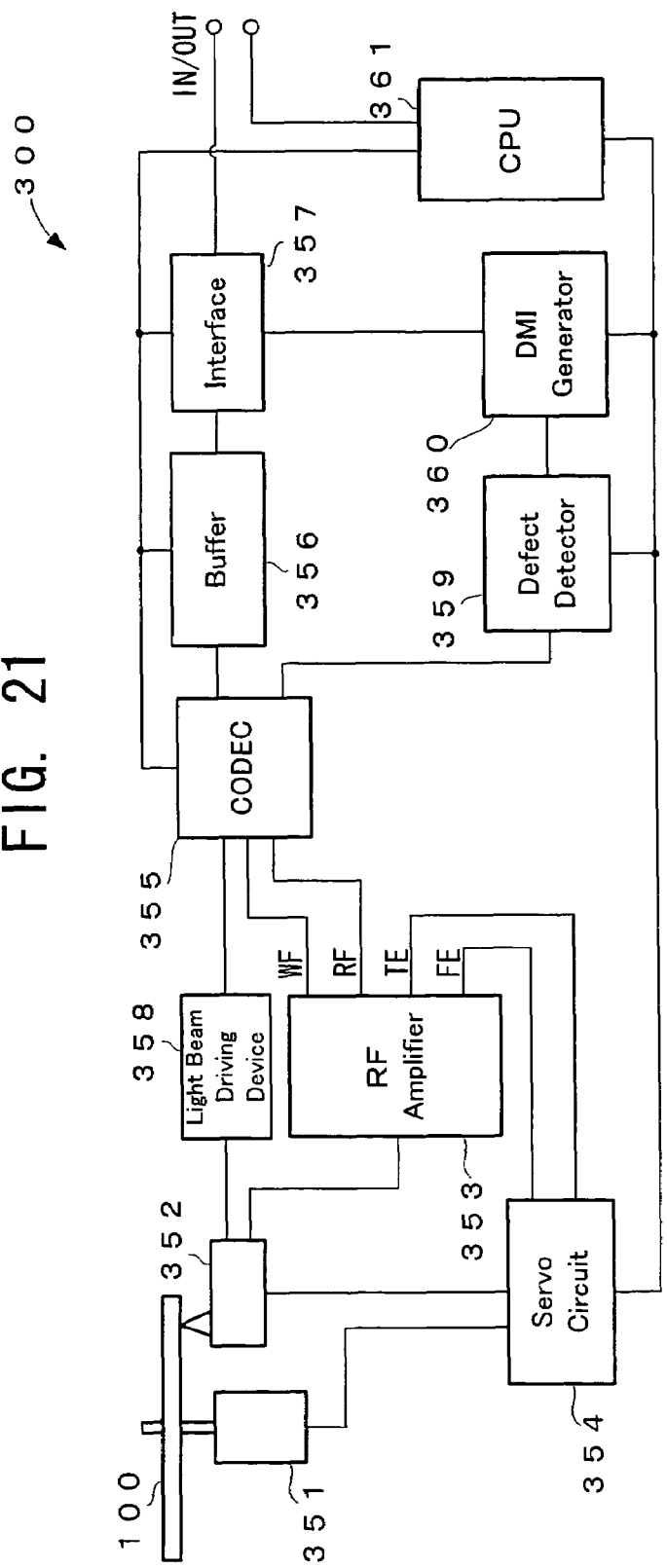
FIG. 21 is a block diagram showing the structure of a disc drive.

FIG. 21 shows the inner structure of the disc drive 300. The disc drive 300 records information onto the optical disc 100 and reads the information recorded on the optical disc 100.

As shown in FIG. 21, the disc drive 300 is provided with: a spindle motor 351; an optical pickup 352; a Radio Frequency (RF) amplifier 353; and a servo circuit 354.

The spindle motor 351 is a motor for rotating the optical disc 100.

The optical pickup 352 records the record data or the like onto the recording surface of the optical disc 100 by irradiating the recording surface with a light beam, and reads the record data or the like recorded on the recording surface by receiving reflected light of the light beam. The optical pickup 352 outputs a RF signal corresponding to the reflected light of the light beam.

The RF amplifier 353 amplifies the RF signal outputted from the optical pickup 352 and outputs it to a Coder/Decoder (CODEC) 355. Moreover, the RF amplifier 353 generates, from the RF signal, a wobble frequency signal WF, a track error signal TE, and a focus error signal FE, and outputs them.

The servo circuit 354 is a servo control circuit for controlling the driving of the optical pickup 352 and the spindle motor 351 on the basis of the track error signal TE, the focus error signal FE, and other servo control signals.

Moreover, as shown in FIG. 21, the disc drive 300 is provided with: the CODEC 355; a buffer 356; an interface 357; and a light beam driving device 358.

The CODEC 355 is a circuit, provided with: a function of performing an error correction for the record data upon reading; and a function of appending an error correction code or mark to the record data upon recording so as to modulate the record data. Specifically, upon reading, the CODEC 355 demodulates and decodes the RF signal outputted from the RF amplifier 353, performs an error correction for the decoded RF signal, and then outputs this to the buffer 356. Moreover, if the error correction is impossible as a result of performing the error correction for the decoded RF signal, the CODEC 355 generates an error-correction-impossible signal for indicating that, and outputs this signal to a defect detector 359. Upon recording, the CODEC 355 appends the error correction code to the record data outputted from the buffer 356, modulates this data to have a code suited to the optical characteristics or the like of the optical disc 100, and then outputs the modulated record data to the light beam driving device 358.

The buffer 356 is a memory circuit for storing the record data temporarily.

The interface 357 is a circuit for controlling the input/output or communication of the record data or the like between the disc drive 300 and the backend 400. Specifically, upon reproducing, the interface 357 responds a request command from the backend 400, and outputs the record data outputted from the buffer 356 (i.e. the record data read from the optical disc 100) to the backend 400. Upon recording, the interface 357 receives the record data which is inputted from the backend 400 to the disc drive 300, and outputs this data to the buffer 356. The interface 357 responds the request command from the backend 400 and outputs all or part of the defect lists maintained in a generator 360 for generating Defect Management Information (DMI generator 360) to the backend 400.

Upon recording, the light beam driving device 358 generates a light beam driving signal corresponding to the record data outputted from the CODEC 355 and outputs this signal to the optical pickup 352. The optical pickup 352 modulates a light beam on the basis of the light beam driving signal, and irradiates the recording surface of the optical disc 100 with it. This causes the recording of the record data or the like onto the recording surface.

Moreover, as shown in FIG. 21, the disc drive 300 is provided with: the defect detector 359; and the DMI generator 360.

The defect detector 359 is a circuit for detecting a defect on the optical disc 100. The defect detector 359 generates a defect detection signal for indicating the presence or absence of a defect, and outputs this signal. The defect detector 359 detects a defect on the basis of the result of the error correction of the record data upon reading information (upon verifying or reproducing). As described above, if the error correction is impossible as a result of performing the error correction for the decoded RF signal, the CODEC 355 generates the error correction impossible signal for indicating the fact, and outputs this signal to the defect detector 359. The defect detector 359 outputs the defect detection signal for indicating the presence of a defect when receiving this error correction impossible signal.

The DMI generator 360 is a circuit for generating or updating the defect management information 140 on the basis of the defect detection signal outputted from the defect detector 359. The defect management information 140 is rewritably stored into a memory circuit placed in the DMI generator 360. The DMI generator 360 responds to the request command from the backend 400 and outputs the defect management information 140 to the backend 400 through the interface 357.

Moreover, as shown in FIG. 21, the disc drive 300 has a Central Processing Unit (CPU) 361. The CPU 361 controls the disc drive 300 as a whole, and controls the exchange of information among the elements in the disc drive 300 described above. The CPU 361 also controls the recording operation and reading operation of the record data and the defect management information 140. The CPU 361 responds to the control command or the request commend transmitted from the backend 400, and controls the exchange of data between the disc drive 300 and the backend 400. Moreover, the CPU 361 generates the status information.

Figure 22:
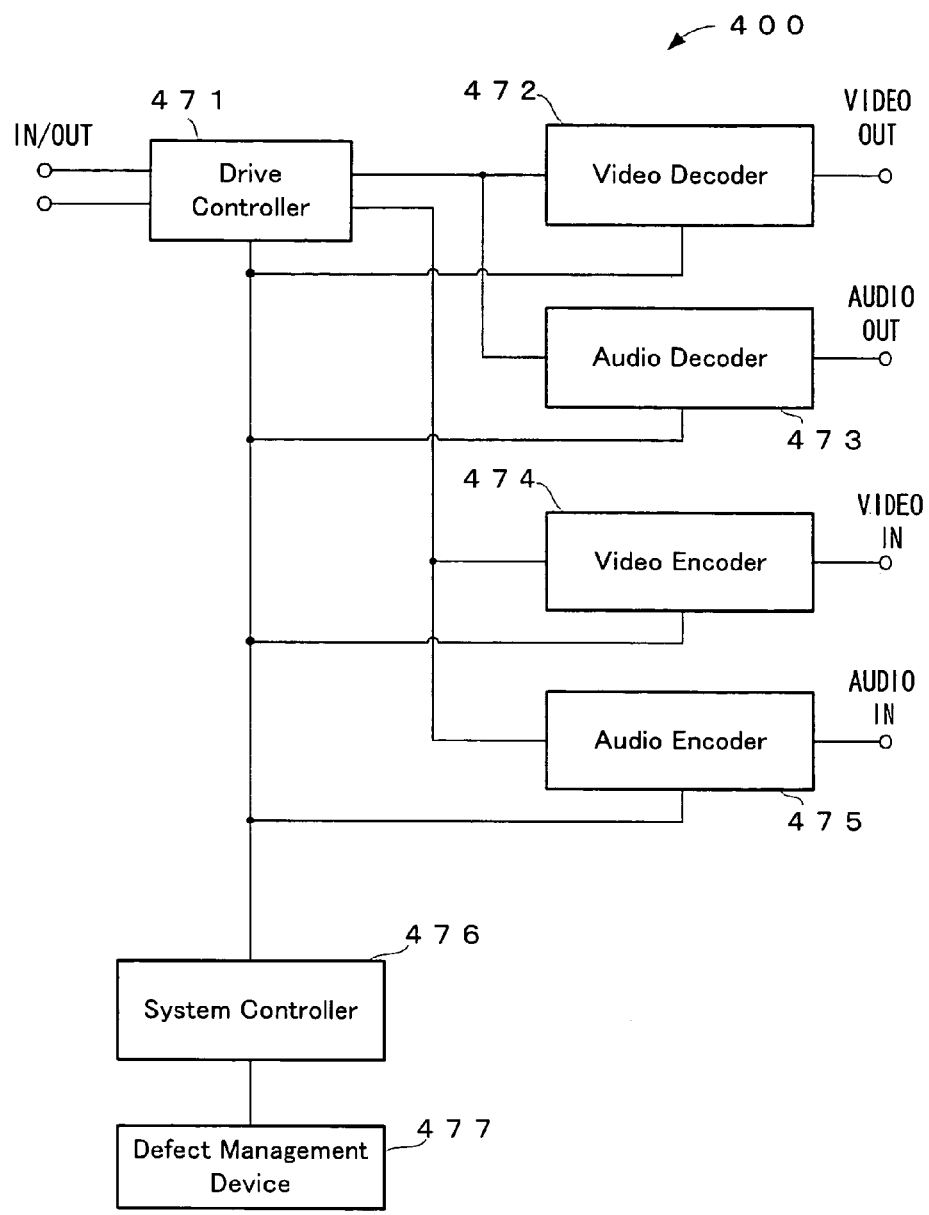
FIG. 22 is a block diagram showing the structure of a backend.

Next, FIG. 22 shows the inner structure of the backend 400. The backend 400 is an apparatus for performing reproduction processing with respect to the record data read by the disc drive 300 from the optical disc 100, receiving the record data supplied from the outside in order to record it onto the optical disc 100, compressing (and encoding) this record data, and transmitting it to the disc drive 300.

The backend 400 is provided with: a drive controller 471; a video decoder 472; an audio decoder 473; a video encoder 474; an audio encoder 475; a system controller 476; and a defect management device 477.

The drive controller 471 is a circuit for controlling the reading processing and recording processing of the disc drive 300. The backend 400 and the disc drive 300 cooperate and perform an operation of reading the record data from the optical disc 100 and reproducing it and an operation of receiving the record data from the outside and recording it onto the optical disc 100. The drive controller 471 realizes the cooperation of the backend 400 and the disc drive 300 by controlling the reading processing and recording processing of the disc drive 300. Specifically, the drive controller 471 outputs to the disc drive 300 request commands about reading, recording, outputting the record data from the buffer 356, outputting the defect management information 140 from the DMI generator 360, and so on. The drive controller 471 also controls the input and output of the record data, the defect management information 140, and other various information.

The video decoder 472 and the audio decoder 473 are circuits for decoding the record data which is read from the optical disc 100 by the disc drive 300 and which is supplied through the drive controller 471, and converting the record data to be reproducible with a display, a speaker, or the like.

The video encoder 474 and the audio encoder 475 are circuit for receiving a video signal, an audio signal, or the like, inputted from the outside for the purpose of recording them on the optical disc 100, compressing and encoding them by Moving Picture Experts Group (MPEG) compressing and encoding method or the like, and supplying them to the disc drive 300 through the drive controller 471.

The system controller 476 is a circuit for controlling: the drive controller 471; the video decoder 472; the audio decoder 473; and the defect management device 477, and performing the reproduction processing of the record data in cooperation with the devices, upon reproducing. Upon recording, the system controller 476 controls: the drive controller 471; the video encoder 474; the audio encoder 475; and the defect management device 477, to thereby record the record data in cooperation with the devices. Upon reproducing and recording, the system controller 476 controls the disc drive 300 (e.g. controls the generation and transmission of various request commands, the reception of a response signal, or the like) with the drive controller 471 in order to realize the cooperation of the disc drive 300 and the backend 400.

The defect management device 477 has therein a memory circuit, and has a function of receiving and maintaining all or part of the defect management information 140 generated or updated by the DMI generator 360 in the disc drive 300. The defect management device 477 performs the defect management with the system controller 476.

Figure 23:
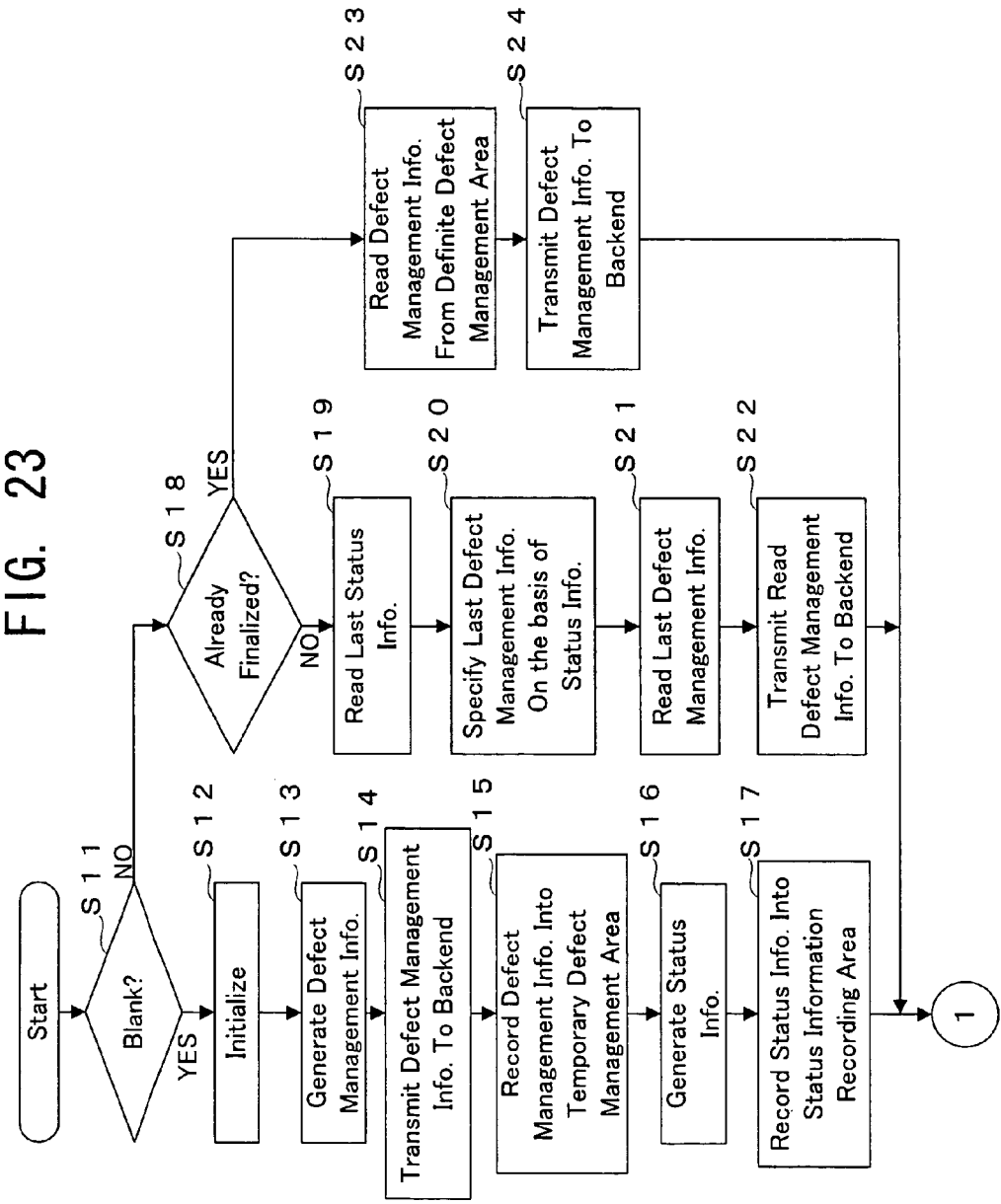
FIG. 23 is a flowchart showing the initial setting of the recording/reproducing apparatus.

Next, the initial setting processing of the recording/reproducing apparatus 200 will be explained. FIG. 23 shows the initial setting of the recording/reproducing apparatus 200. The recording/reproducing apparatus 200 performs the initial setting between (i) when the optical disc 100 is inserted or loaded in the drive unit 300 and (ii) when the record data is recorded or reproduced (at the preparation stage of the recording and the reproduction). The initial setting is processing for preparing for the recording or the reproduction of the record data, and includes various processing. Out of the various processing, the initialization of the optical disc 100, the generation and the recording of the defect management information 140, the generation and the recording of the status information, the transmission of the defect management information 140 to the backend 400, or the like will be explained below. The processing is performed mainly under the control of the CPU 361 of the drive unit 300.

As shown in FIG. 23, when the optical disc 100 is inserted or loaded into the drive unit 300, the CPU 361 of the drive unit 300 judges whether or not the optical disc 100 is an unrecorded disc (i.e. a blank disc) (step S11).

If the optical disc 100 is a blank disc (the step S11: YES), the CPU 361 initializes the optical disc 100 (step S12). In this initializing, the DMI generator 360 generates the defect management information 140 (step S13). Specifically, it obtains the start address and end address of the user data area 101 and the areal sizes of the spare areas 102A and 102B, which are set in the initializing, and generates the setting information 141. Moreover, it generates the defect list 142. The defect list 142 generated at this time has only an outline or frame, not having any content. Namely, the defect address is not recorded in it, nor is the specific spare address. A header, identification or discrimination information, or the like are only recorded. The generated defect management information 140 is stored and maintained in the DMI generator 360.

Then, the CPU 361 transmits the defect management information 140 stored in the DMI generator 360, to the backend 400 (step S14). The defect management information 140 is stored into the defect management device 477 of the backend 400.

Then, the CPU 361 records the defect management information 140 stored in the DMI generator 360, into the temporary defect management area 106A on the optical disc 100 (step S15).

Then, the CPU 361 generates the status information 150 (step S16). In the step S15, the defect management information 140 is recorded in the temporary defect management area 106A, so that the bit 0 of the last defect management information flag is set to "1", and the bit 1 and the bit 2 thereof are individually set to "0".

Then, the CPU 361 records the status information 150 into the status information recording area 107 on the optical disc 100 (step S17).

On the other hand, if the optical disc 100 is not a blank disc (the step S11: NO), then, the CPU 361 judges whether or not the optical disc 100 is already finalized (step S18).

If the optical disc 100 is not finalized (the step S18: NO), the CPU 361 performs the reading processing of the last defect management information 140 recorded on the optical disc 100, on the basis of the status information. Namely, if the optical disc 100 is not a blank disc, one or several pieces of defect management information which are already generated in the past are recorded in the temporary defect management areas 106A, 106B, and 106C. Thus, the CPU 361 specifies and reads the last defect management information, from among the one or several pieces of defect management information which are recorded in the temporary defect management areas 106A, 106B, and 106C, on the basis of the status information.

Specifically, at first, the CPU 361 specifies and reads the last status information, from among the status information 150 recorded in the status information recording area on the optical disc 100 (step S19).

Then, the CPU 361 refers to the last defect management information flag included in the read status information 150, recognizes the temporary defect management area in which the last defect management information is recorded, and specifies the last defect management information (step S20).

Then, the CPU 361 reads the last defect management information 140 (step S21).

Then, the CPU 361 stores the read defect management information 140 into the DMI generator 360, and transmits this information to the backend 400 (step S22). The defect management information 140 is stored into the defect management device 477 of the backend 400.

On the other hand, if the optical disc 100 is not a blank disc but is already finalized (the step S18: YES), the CPU 361 reads the defect management information 140 from the definite defect management area 105 (step S23), and transmits this information to the backend 400 (step S24). The defect management information 140 is stored into the defect management device 477 of the backend 400.

By virtue of the initial setting described above, the defect management information 140 is stored into the DMI generator 360 of the disc drive 300, and is stored into the defect management device 477 of the backend 400. By this, the preparation for the updating of the defect management information 140 is completed on DMI generator 360. On the other hand, the preparation for the defect management is completed on the defect management device 477.

Figure 24:
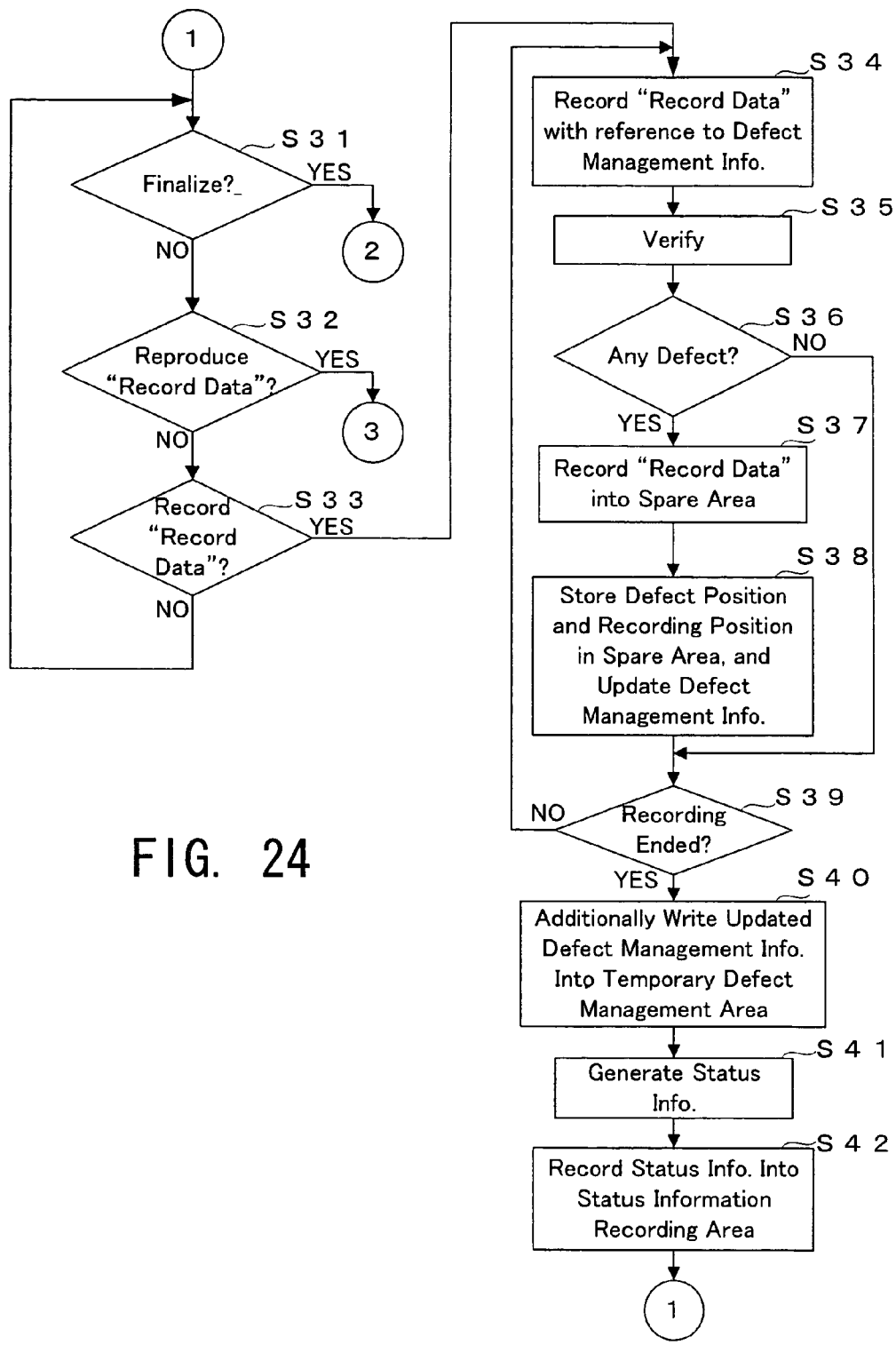
FIG. 24 is a flowchart showing the recording processing of the recording/reproducing apparatus.

Next, the recording processing of the recording/reproducing apparatus 200 will be explained. FIG. 24 mainly shows the recording processing of the recording/reproducing apparatus 200. The recording/reproducing apparatus 200 performs the recording processing of recording the record data into the user data area 101 on the optical disc 100. The recording/reproducing apparatus 200 performs verifying during the recording processing, and updates the defect list 142 on the basis of the result of the verifying. The recording processing is realized by the cooperation of the CPU 361 of the disc drive 300 and the system controller 476 of the backend 400.

As shown in FIG. 24, if a user inputs an instruction of starting to record (step S33: YES), the recording/reproducing apparatus 200 responds to this and records the record data (step S34). The record data is recorded into each predetermined block.

The recording/reproducing apparatus 200 performs verifying at each time of the one block recording (step S35), and updates the defect management list 142 stored in the DMI generator 360, on the basis of the result of the verifying. Specifically, if it is recognized, as a result of the verifying, that the record data fails to be recorded (step S36: YES), the CPU 361 records the record data that fails to be recorded, into the spare area 102A or 102B (step S37). Then, the CPU 361 estimates that there is a defect in a place in which the record data is supposed to be recorded, and records the defect address for indicating the place and the corresponding spare address onto the defect list 142 (step S38).

When the processing in the above-described steps S34 to S38 ends with respect to a series of blocks of the record data to be recorded this time, the CPU 361 additionally records the updated defect management information 140 (i.e. the defect management information 140 including the updated defect list 142) into any one of the temporary defect management areas 106A, 106B, and 106C on the optical disc 100 (step S40). At this time, the updated defect management information 140 is recorded next to the previously recorded defect management information. Incidentally, if there is no unrecorded are in the temporary defect management area that has the previously recorded defect management information, the updated defect management information 140 is recorded into another unrecorded temporary defect management area. In determining a place into which the updated defect management information 140 is to be recorded, it is also possible to use the status information read in the step S19 in FIG. 23.

Then, the CPU 361 generates the status information 150 (step S41). Since the updated defect management information 140 is additionally recorded in any one of the temporary defect management areas 106A, 106B, and 106C on the optical disc 100, the recording statuses of the temporary defect management areas 106A, 106B, and 106C are changed. Specifically, the defect management information 140 which is updated and additionally recorded this time becomes the new last defect management information. Thus, the CPU 361 generates (or updates) the status information 150, in order to reflect such a change of the recording status. The CPU 361 recognizes the temporary defect management area in which the defect management information 140 is additionally recorded in the step S40, so that the CPU 361 can generate the status information 150, on the basis of the recognition.

Then, the CPU 361 additionally records the new status information 150, into the status information recording area 107 on the optical disc 100 (step S42). The new status information is additionally recorded next to the previously recorded status information, continuously. Then, the recording processing is completed.

Figure 25:
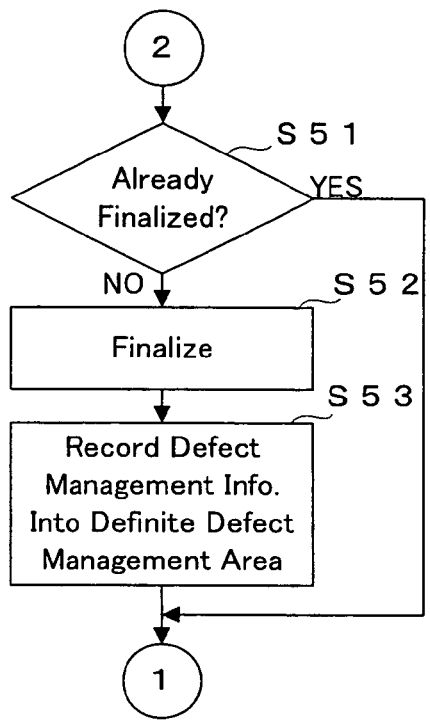
FIG. 25 is a flowchart showing the finalize processing of the recording/reproducing apparatus.

Next, the finalize processing of the recording/reproducing apparatus 200 will be explained. FIG. 25 shows the finalize processing of the recording/reproducing apparatus 200. For example, if the user inputs an instruction for indicating to finalize (the step S31 in FIG. 24: YES), the recording/reproducing apparatus 200 confirms that the optical disc 100 is not finalized yet (step S51: NO) and finalizes the optical disc 100 (step S52). Upon finalizing, the recording/reproducing apparatus 200 records the defect management information 140 stored in the DMI generator 360, into the definite defect management area 105 on the optical disc 100 (step S53). Then, the finalizing is completed.

Figure 26:
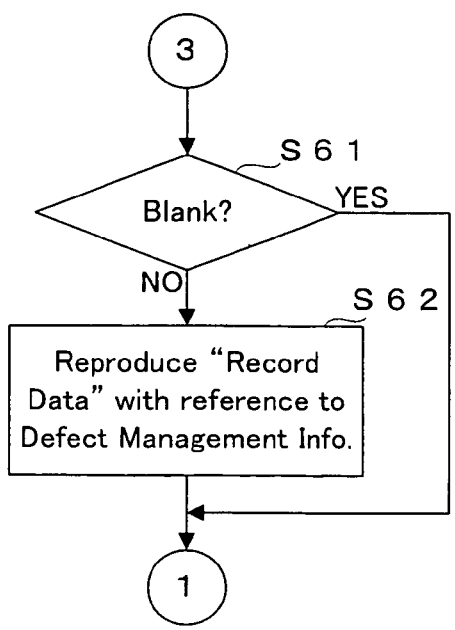
FIG. 26 is a flowchart showing the reproduction processing of the recording/reproducing apparatus.

Next, the reproduction processing of the recording/reproducing apparatus 200 will be explained. FIG. 26 shows the reproduction processing of the recording/reproducing apparatus 200.

If the user inputs an instruction of starting to reproduce (the step S32 in FIG. 24: YES), the recording/reproducing apparatus 200 confirms that the optical disc 100 is not a blank disc (the step S61: NO), and reproduces the record data recorded in the user data area 101 on the optical disc 100 (step S62). The recording/reproducing apparatus 200 reproduces the record data, while performing the defect management on the basis of the defect management information 140 stored in the defect management device 477 of the backend 400.

As described above, according to the recording/reproducing apparatus 200, (a) it generates the status information 150 and records this information into the status information recording area 107 on the optical disc 100 if recording the updated defect management information 140 into any one of the temporary defect management areas 106A, 106B, and 106C on the optical disc 100. Moreover, (b) it reads the status information 150 recorded in the status information recording area 107, and specifies the last defect management information 140 recorded in any one of the temporary defect management areas 106A, 106B, and 106C, on the basis of the status information 150. By this, it is possible to realize the quick specification and reading of the last defect management information.

The present invention can be changed if desired without departing from the scope or spirit of the invention which can be read from the claims and the entire specification. A write-once-type recording medium, a recording apparatus, a reproducing apparatus, a recording method, a reproducing method, and a computer program that realizes these functions, which accompany such changes, are also intended to be within the technical scope of the present invention.

INDUSTRIAL APPLICABILITY

A write-once-type recording medium, a recording apparatus and a recording method for the write-once-type recording medium, a reproducing apparatus and a reproducing method for the write-once-type recording medium, and a computer program that realizes these functions associated with the present invention can be applied to a high-density recording medium, such as an optical disc, a magnetic disc, and a magneto-optical disc, for example. Moreover, they can be applied to a recording medium, a recording/reproducing apparatus, or the like, which are mounted on or can be connected to various computer equipment, for example.

The invention claimed is:
1. A write-once-type recording medium comprising:
a data area to record therein record data;
a control information recording area to record therein information for controlling an operation of recording and/or reading in said data area, said control informa- tion recording area including a definite defect management area to record therein defect management information of said data area;

a plurality of temporary defect management areas, which are discretely placed, to temporarily record therein the defect management information of said data area; and a status information recording area in which status information for indicating recording statuses of said plurality of temporary defect management areas discretely placed is to be recorded, at least one of said plurality of temporary defect management areas being placed between said control information recording area and said data area.

2. The write-once-type recording medium according to claim 1, wherein the status information includes information for indicating presence or absence of an unrecorded area in said plurality of temporary defect management areas.

3. The write-once-type recording medium according to claim 1, wherein the one temporary defect management area is placed between said control information recording area, which is placed on an inner circumferential side of said data area, and said data area.

4. The write-once-type recording medium according to claim 1, wherein the one temporary defect management area is placed between said control information recording area, which is placed on an outer circumferential side of said data area, and said data area.

5. The write-once-type recording medium according to claim 1, wherein said plurality of temporary defect management areas are larger than said definite defect management area.

6. The write-once-type recording medium according to claim 1, wherein the defect management information is recorded repeatedly a plurality of times into said definite defect management area.

7. A recording apparatus for recording record data onto a write-once-type recording medium comprising: (i) a data area to record therein the record data; (ii) a control information recording area to record therein information for controlling an operation of recording and/or reading in said data area, said control information recording area including a definite defect management area to record therein defect management information of said data area; (iii)a plurality of temporary defect management areas, which are discretely placed, to temporarily record therein the defect management information of said data area; and (iv) a status information recording area in which status information for indicating recording statuses of said plurality of temporary defect management areas discretely placed is to be recorded, at least one of said plurality of temporary defect management areas being placed between said control information recording area and said data area, said recording apparatus comprising:

a first recording device for recording the record data into said data area;

a second recording device for recording the defect management information, into any one of said plurality of temporary defect management areas;

a status information generating device for generating the status information for indicating the recording statuses of said plurality of temporary defect management areas; and a third recording device for recording the status information generated by said status information generating device, into said status information recording area.

8. A reproducing apparatus for reproducing record data recorded on a write-once-type recording medium comprising: (i) a data area to record therein the record data; (ii) a control information recording area to record therein information for controlling an operation of recording and/or reading in said data area, said control information recording area including a definite defect management area to record therein defect management information of said data area; (iii) a plurality of temporary defect management areas, which are discretely placed, to temporarily record therein the defect management information of said data area; and (iv) a status information recording area in which status information for indicating recording statuses of said plurality of temporary defect management areas discretely placed is to be recorded, at least one of said plurality of temporary defect management areas being placed between said control information recording area and said data area, said reproducing apparatus comprising:

a first reading device for reading the status information recorded in said status information recording area;

an area recognizing device for recognizing one temporary defect management area in which the defect management information recorded at last in time is recorded, on the basis of the status information read by said first reading device;

a second reading device for reading the defect management information recorded in the one temporary defect management area recognized by said area recognizing device; and a reproducing device for reproducing the record data recorded in said data area, on the basis of the defect management information read by said second reading device.

* * * * *